United States Patent [19]

Matsuda et al.

[11] Patent Number: 5,533,041
[45] Date of Patent: Jul. 2, 1996

[54] OPTICAL TRANSMISSION AND RECEPTION DEVICE

[75] Inventors: Manabu Matsuda; Hajime Shoji, both of Kawasaki, Japan

[73] Assignee: Fujitsu Limited, Kawasaki, Japan

[21] Appl. No.: 395,530

[22] Filed: Feb. 28, 1995

Related U.S. Application Data

[63] Continuation of Ser. No. 105,697, Aug. 13, 1993, abandoned.

[30] Foreign Application Priority Data

Aug. 18, 1992 [JP] Japan .................................... 4-219346

[51] Int. Cl.⁶ ....................................................... H01S 3/19
[52] U.S. Cl. ................................ 372/50; 257/80; 372/45; 372/46; 372/92; 372/96
[58] Field of Search .................................. 372/50, 96, 45, 372/46; 257/80

[56] References Cited

U.S. PATENT DOCUMENTS

| | | | |
|---|---|---|---|
| 4,349,906 | 9/1982 | Scitres et al. | 372/50 |
| 5,220,573 | 6/1993 | Sakata et al. | 372/50 |
| 5,281,829 | 1/1994 | Chinen | 257/80 |
| 5,404,373 | 4/1995 | Cheng | 372/50 |

FOREIGN PATENT DOCUMENTS

| | | |
|---|---|---|
| 0053742 | 6/1982 | European Pat. Off. . |
| 0187198 | 7/1986 | European Pat. Off. . |
| 0226868 | 7/1987 | European Pat. Off. . |
| 0477086 | 3/1992 | European Pat. Off. . |

OTHER PUBLICATIONS

Patent Abstracts of Japan, vol. 12, No. 357 (E–662), Sep. 26, 1988.
Patent Abstracts of Japan, vol. 12, No. 498 (E–698), Dec. 24, 1988.

*Primary Examiner*—James W. Davie
*Attorney, Agent, or Firm*—Staas & Halsey

[57] ABSTRACT

An optical transmission and reception device comprises an optical transmission region including an active layer which oscillates and outputs laser beam of a wavelength λ1 on a transmission state, and guides received light of a wavelength λ2 different from the wavelength λ1 on a reception state and an optical reception region including a light detecting device for detecting the received light guided by the active layer and converting the received light into electric signals. The optical transmission and reception device having an optimum structure for the transmission and reception can be realized. Accordingly an optical transmission and reception device having good characteristics, which are suitably used in bidirectional communications by optical subscribers' systems, and optical parallel link data transmission in computers.

18 Claims, 27 Drawing Sheets

OPTICAL TRANSMISSION AND RECEPTION DEVICE

This application is a continuation of application Ser. No. 08/105,697, filed Aug. 13, 1993, now abandoned.

BACKGROUND OF THE INVENTION

The present invention relates to an optical transmission and reception device to be used in bidirectional communications, and in transmission of optical parallel link data in computers, and a method for fabricating the same.

Semiconductor lasers have been conventionally used as optical transmission and reception devices to be used in bidirectional communications in optical subscribers' systems, and as optical transmission and reception devices to be used in transmissions of optical parallel link data in computers.

A semiconductor laser conventionally used as an optical transmission and reception device will be explained with reference to FIG. 1.

An n-InP substrate 200 has the upper portion formed in the shape of a mesa, and an active layer 212 of InGaAsP is formed on the top of the mesa. The mesa is buried with a p-InP layer 202. An n-InP layer 204 is formed on the top of the p-InP layer 202 except the top of the active layer 212. A p-InP layer 206 is formed on the tops of the n-InP layer 204 and the active layer 212. The p-InP layer 202, the n-Inp layer 204 and the p-Inp layer 206 constitute a current blocking layer.

A contact layer 209 of p-InGaAsP is formed on the p-InP layer 206. A silicon oxide film 210 is formed on the contact layer 208, and a positive electrode 210 is formed on the top of the silicon oxide film 210, and a negative electrode 214 is formed on the underside of an n-InP substrate.

In using this conventional semiconductor laser of such structure as an optical transmission and reception device, on an optical transmission, the semiconductor laser is caused to emit light, and, on an optical reception, the semiconductor laser is supplied with a reverse bias voltage to serve as an optical receiver.

But the above-described optical transmission and reception device has the following drawbacks.

The above-described optical transmission and reception device is intrinsically a semiconductor laser having an optimum structure for a transmitter (light emitter), but does not have an optimum structure for a light detector. Accordingly the semiconductor laser has low photoelectric conversion efficiency for converting received light to an electric amount, and has large dark currents.

The light absorbing layer which absorbs light has such a small volume that the semiconductor laser has low photoelectric conversion efficiency for converting received light to an electric amount.

In such circumstances, an optical transmission and reception device having an optimum structure for the transmission and reception is needed.

SUMMARY OF THE INVENTION

An object of the present invention is to provide an optical transmission and reception device having an optimum structure for the transmission and reception, and a method for fabricating the same.

The above-described object is achieved by an optical transmission and reception device comprising an optical transmission region including an active layer which oscillates and outputs laser beam of a wavelength $\lambda 1$ on a transmission state, and guides received light of a wavelength $\lambda 2$ different from the wavelength $\lambda 1$ on a reception state, and an optical reception region including a light detecting device for detecting the received light guided by the active layer and converting the received light into electric signals.

In the above-described optical transmission and reception device, the optical transmission region further includes received light transmitting means for transmitting outside the received light guided by the active layer, and the optical reception region detects the received light transmitted from the received light transmitting means.

In the above-described optical transmission and reception device, the received light transmitting means is a diffraction grating formed along the active layer, and having a grating constant which does not diffract the transmitted light but diffracts the received light.

In the above-described optical transmission and reception device, the diffraction grating is so formed that the grating constant is gradually decreased in the direction of guide of the received light by the active layer.

In the above-described optical transmission and reception device, the optical reception region is formed on one side of the active layer, and detects the received light guided in the active layer.

In the above-described optical transmission and reception device, the optical transmission region includes distributed bragg reflectors on both sides of the active layer, the distributed bragg reflectors reflecting the transmitted light of the wavelength $\lambda 1$ and transmitting the received light of the wavelength $\lambda 2$.

In the above-described optical transmission and reception device, the optical reception region is formed on one surface of a semiconductor substrate, and the optical transmission regions is formed on the optical reception region.

In the above-described optical transmission and reception device, the optical reception region is formed on one surface of a semiconductor substrate, and the optical transmission region is formed on the other surface of the semiconductor substrate.

The above-described object is achieved by a method for fabricating an optical transmission and reception device comprising the steps of forming an optical reception region including a light detecting device for detecting light and converting the same into electric signals, and forming on the optical reception region an optical transmission region including an active layer which oscillates and outputs laser beam of a wavelength $\lambda 1$ on a transmission state, and guides received light of a wavelength $\lambda 2$ different from the wavelength $\lambda 1$ on a reception state.

The above-described object is achieved by a method for fabricating an optical transmission and reception device comprising the steps of forming on one surface of a semiconductor substrate an optical reception region including a light detecting device for detecting light and converting the same into electric signals, and forming on the other surface of the semiconductor substrate an optical transmission region including an active layer which oscillates and outputs laser beam of a wavelength $\lambda 1$ on a transmission state, and guides received light of a wavelength $\lambda 2$ different from the wavelength $\lambda 1$ on a reception state.

The above-described object is achieved by a method for fabricating an optical transmission and reception device comprising the steps of forming on one surface of a first semiconductor substrate an optical reception region including a light detecting device for detecting light and converting the same into electric signals, forming on one surface of a second semiconductor substrate an optical transmission region including an active layer which oscillates and outputs laser beam of a wavelength $\lambda 1$ on a transmission state, and guides received light of a wavelength $\lambda 2$ different from the wavelength $\lambda 1$ on a reception state, and bonding the other surface of the first semiconductor substrate and the other surface of the second semiconductor substrate to integrate the optical reception region and the optical transmission region.

According to the present invention, an optical transmission and reception device having an optimum structure for the transmission and reception can be realized. Accordingly an optical transmission and reception device having good characteristics, which are suitably used in bidirectional communications by optical subscribers' systems, and optical parallel link data transmission in computers.

DETAILED DESCRIPTION OF THE INVENTION

Figure 3:
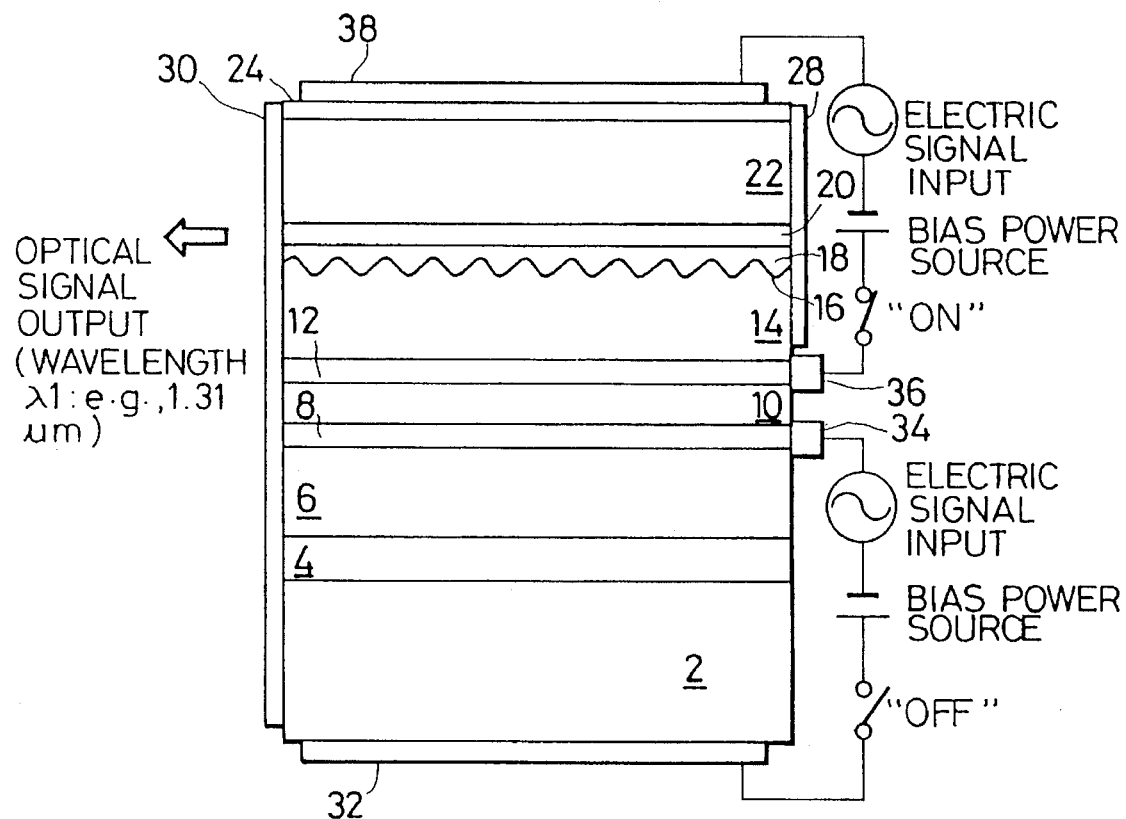
FIG. 3 is an explanatory view of the optical transmitting operation of the optical transmission and reception device according to the first embodiment of the present invention.
Figure 4:
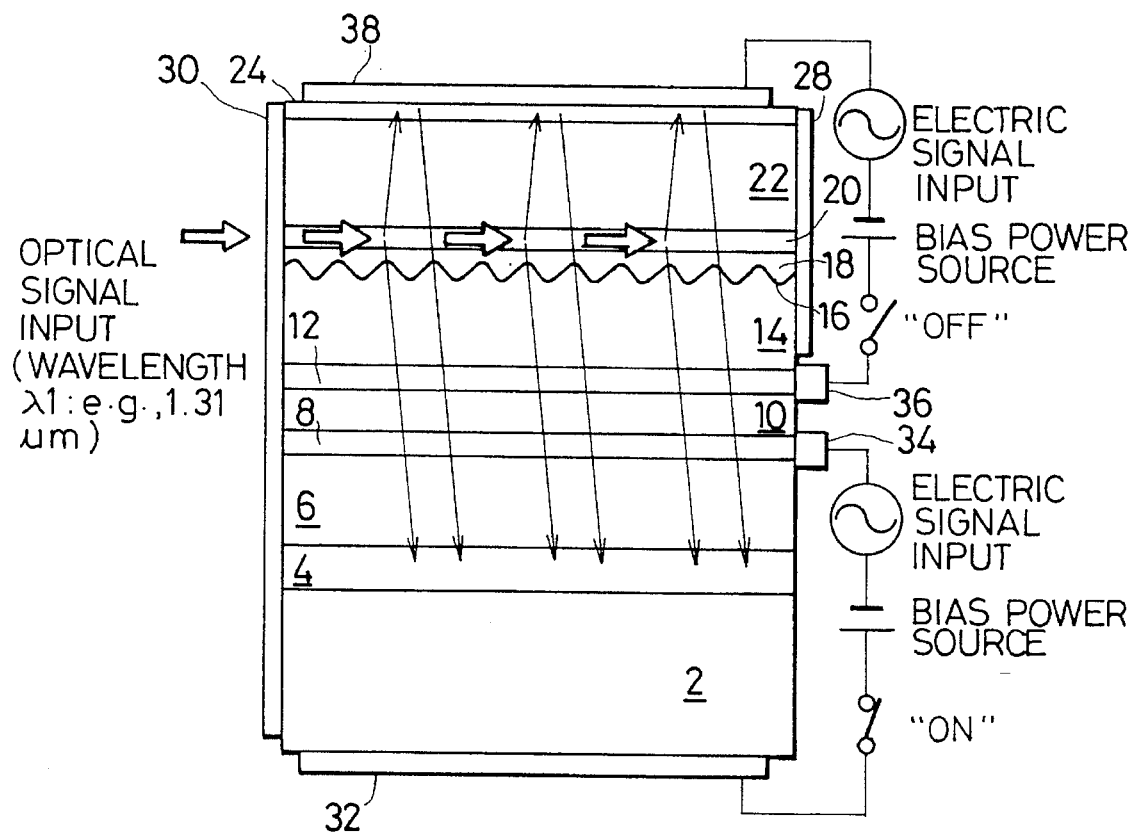
FIG. 4 is an explanatory view of the optical receiving operation of the optical transmission and reception device according to the first embodiment of the present invention.

The optical transmission and reception device according to a first embodiment of the present invention will be explained with reference to FIGS. 2 to 4.

First, a structure of the optical transmission and reception device according to the present embodiment of the present invention will be explained with reference to FIG. 2.

Figure 1:
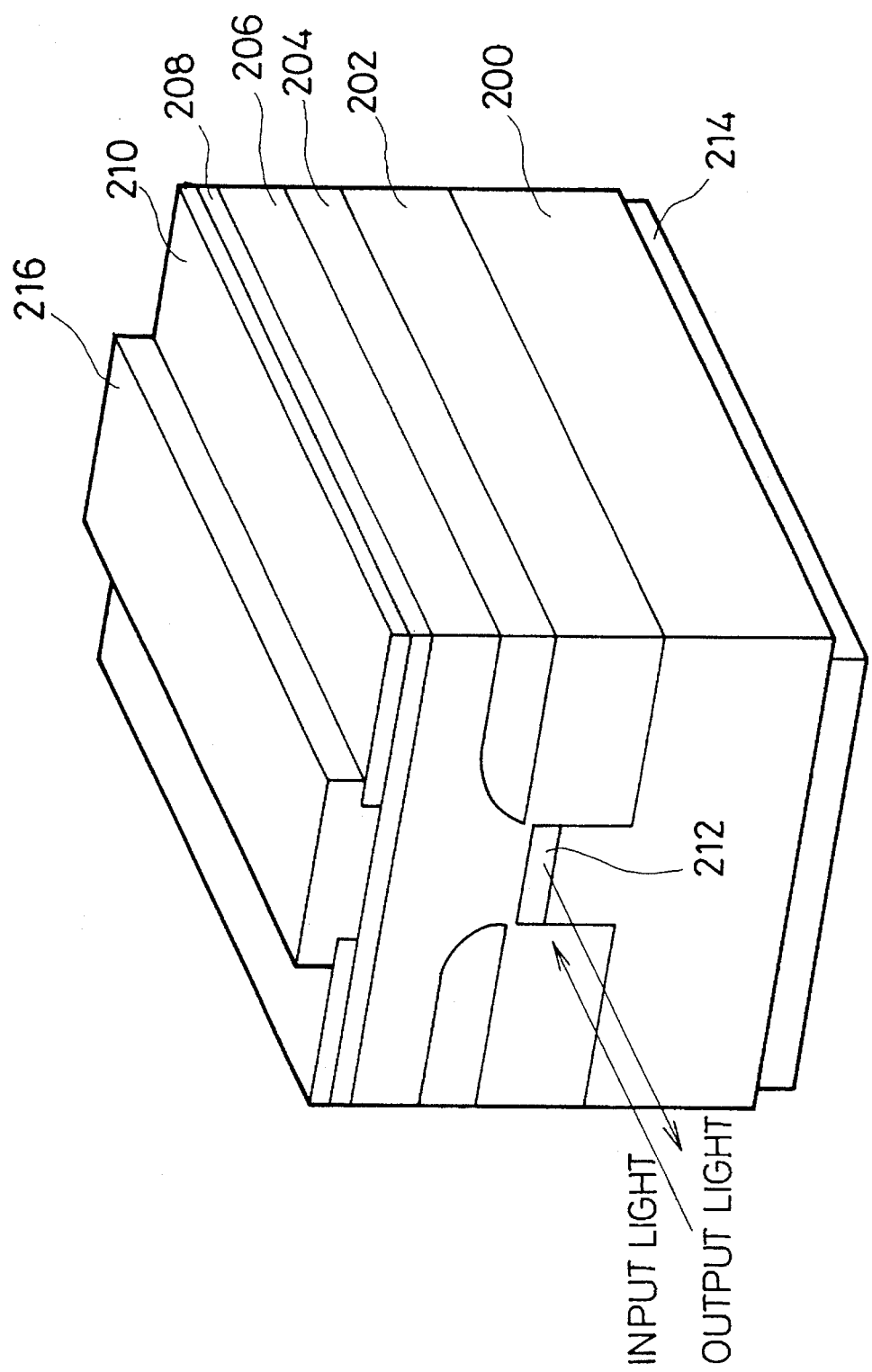
FIG. 1 is a view of a conventional optical transmission and reception device.
Figure 2:
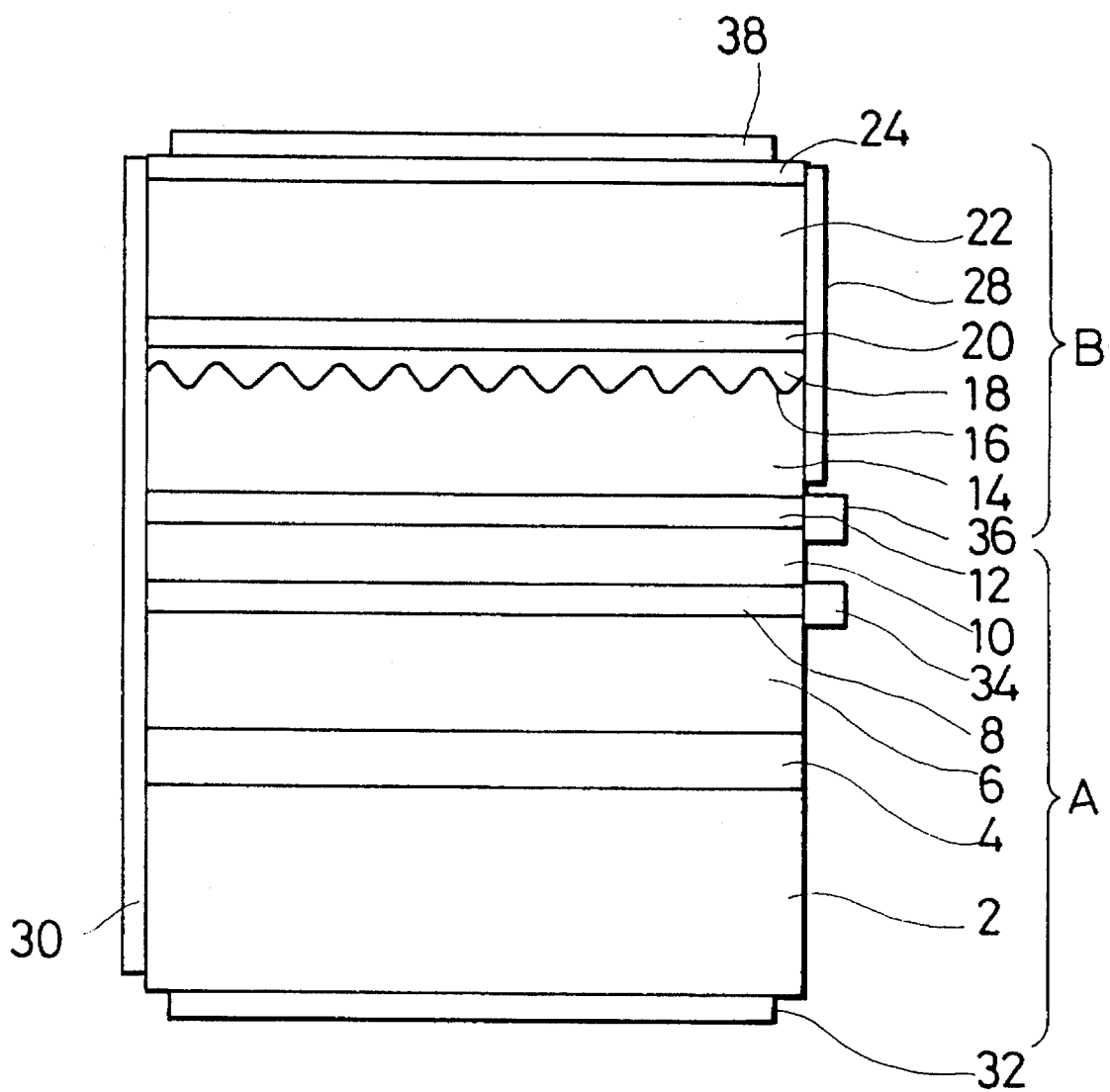
FIG. 2 is a view of the optical transmission and reception device according to a first embodiment of the present invention.

An n-InP substrate 2 to a contact layer 12 corresponding to a region indicated by A in FIG. 2 is an optical reception region (hereinafter called "optical reception region A") for detecting received light and converting the received light into electric signals. The contact layer 12 to a contact layer 24 corresponding to a region indicated by B in FIG. 2 is a optical transmission region (hereinafter called "optical transmission region B") for, on a transmission state, oscillating laser beams and outputting the same as transmitted light, and, on a reception state, guiding the received light. The optical transmission region B is a Fabry-Perot semiconductor laser including a pair of opposed plane mirrors and a stripe-type waveguide. The optical reception region A is a PIN photo-diode.

A light absorbing layer 24 of InGaAs or InGaAsP is formed on an n-InP substrate 2. This light absorbing layer 4 is of bulk-type. A p-InP layer 6 is formed on the light absorbing layer 4. A contact layer 8 is formed on the p-InP layer 6. An SI(semi-insulating)-InP layer 10 is formed on the contact layer 8. A p-InGaAsP contact layer 12 is formed on the SI-InP layer 10. A p-InP clad layer 14 is formed on the contact layer 12. A p-InGaAsP guide layer 18 is formed on the p-InP clad layer 14. A diffraction grating 16 is formed on the interface between the guide layer 18 and the clad layer 14. An i-InGaAsP active layer 20 is formed on the guide layer 18. An i-InGaAsP active layer 20 is formed on the guide layer 18.

The diffraction grating 16 does not function to cause the transmission region to oscillate as a DFB laser, but functions as received light transmitting means for propagating received light as input light which has been received on the active layer 20 to the light absorbing layer 4 on a reception. Thus, the diffraction grating 16 does not diffract transmitted light emitted from the active layer 20 but diffracts received light received in the active layer 20.

In the present embodiment, the active layer 20 oscillates laser beams of a wavelength of $\lambda 1=1.31$ µm as transmitted light, and guides received light of a wavelength of $\lambda 2=1.55$ µm as input light. It is necessary that the active layer 20 is formed of a material which can oscillate light of a $\lambda 1$-wavelength and does not absorb light of a $\lambda 2$-wavelength, that is, has a band gap energy larger than energy of $\lambda 2$-wavelength light. Thus the $\lambda 1$-wavelength of output light is smaller than the $\lambda 2$-wavelength of input light. In the present embodiment, the active layer 20 is formed of i-InGaAsP.

A clad layer 22 of n-InP is formed on the active layer 20, and a contact layer 24 of n-InGaAsP layer is formed on the clad layer 22. A dielectric film 30 is formed on the left side as viewed in FIG. 2, and a dielectric film 28 is formed on the side from the clad layer 14 to the contact layer 24.

An electrode 32 is formed on the underside of the n-InP substrate 2. Respective electrodes 34, 36 are formed on the contact layers 8, 12. An electrode 38 is formed on the contact layer 24.

The operation of the optical transmission and reception device according to the present embodiment will be explained with reference to FIGS. 3 and 4. FIG. 3 explains the operation of the optical transmission and reception device according to the present embodiment which is in its transmitting operation. The reception A alone is driven with a bias voltage applied between the electrodes 32, 34 and without a bias voltage applied between the electrodes 36, 38, and a light signal of a $\lambda 2$-wavelength optical signal inputted to the active layer 20 is diffracted by the diffraction grating 16 to be guided to the light absorbing layer 4. Thus, the optical transmission and reception device according to the present embodiment operates as the reception device.

Then the operation of guiding input light of a $\lambda 2$-wavelength inputted to the active layer 20 in the transmission and reception device according to the present embodiment will be explained. Here is considered a case, for example, that laser beams emitted on an optical transmission has a wavelength $\lambda 1$ of $\lambda 1=1.31$ µm, and optical signals inputted upon an optical reception has a wavelength $\lambda 2$ of $\lambda 2=1.55$ µm.

In the optical transmission and reception device according to the present embodiment, the guide layer 18 as an optical waveguide layer is formed near the active layer 20 as the light emitting region, and the diffraction grating 16 is formed on the interface between the guide layer 18 and the clad layer 14. This diffraction grating 16 does not function as a diffraction grating for a distributed feedback semiconductor laser (DFB laser), which generates reflected waves, and has a diffraction grating period which do not diffract laser beams of a $\lambda 1$-wavelength emitted on a transmission state but diffract input light of a $\lambda 2$-wavelength to the light absorbing layer 4.

The diffraction grating 16 has a diffraction grating period $\Lambda$ which satisfies $$m\lambda=2n_{eq}\Lambda \quad (m=1,2,3,\ldots) \tag{1}$$

where a diffraction grating period (a grating constant) is represented by $\Lambda$, and an equivalent refractive index of the laser waveguide is represented by $n_{eq}$, and $$2\lambda=2n_{eq}\Lambda \tag{2}$$

In the present embodiment, a diffraction grating period $\Lambda$ of the diffraction grating 16 is 0.48 µm. For m=1 (primary diffracted light), when an equivalent refractive index $n_{eq}$ is 3.25, $\lambda=1.56$ µm. Accordingly this diffraction grating 16 diffracts input light of a $\lambda 2$-wavelength, but does not diffract output light of a $\lambda 1$-wavelength.

Thus, the optical transmission and reception device according to the present embodiment is characterized in that the active layer for oscillating light of a $\lambda 1$-wavelength, and the light absorbing layer for absorbing light of a $\lambda 2$-wavelength are included in one and the same device or on one and the same semiconductor substrate.

In the optical transmission and reception device according to the present embodiment, the optical transmission region B is provided by a Fabry-Perot semiconductor laser, but instead may be provided by a distributed feedback semiconductor laser (DFB laser) separately including a diffraction grating for diffracting light of a $\lambda 1$-wavelength. In this case, the diffraction grating may be provided by an index matching distributed feedback semiconductor laser with phase shifts, or by a refractive index matching distributed feedback semiconductor laser without phase shifts. The optical transmission region B may be provided by a gain matching distributed feedback semiconductor laser or a distributed reflection semiconductor laser. In this case, a waveguide layer is formed separately from the guide layer 18 with the diffraction grating 16 formed on, and a diffraction grating for diffracting output light of a $\lambda 1$-wavelength is formed on the waveguide layer.

In the optical transmission and reception device according to the first embodiment, to apply an electric field perpendicularly to the light absorbing layer 4, the electrodes are provided above and below the light absorbing layer 4. To apply an electric field horizontally to the light absorbing layer 4, an electrode is provided on one side of the light absorbing layer 4. In the case that the optical transmission region B is provided by a DFB laser, a matching coefficient may be uneven in the oscillator (vary at positions). Otherwise, electrodes of this semiconductor laser may be separated in the direction of the resonator so that uneven currents can be injected for the end of tuning oscillated wavelengths or for the end of frequency-modulating oscillated wavelengths.

In the case that the optical transmission region B is provided by a distributed reflection semiconductor laser (DBR laser), for the end of tuning oscillated wavelengths or for the end of frequency-modulating oscillated wavelengths, the electrodes may be separated in the direction of the resonator. In the case that a DBR laser is used, distribution reflectors may be provided on both sides of the active region, or a distribution reflector may be provided only on the side of the active region opposed to the exit end surface thereof. Furthermore, a plurality of phase adjusting region may be provided between the active region and the distributed reflection region. One or more electrodes may be provided in each region.

The end surfaces of the optical transmission region B of the transmission and reception device according to the present embodiment are treated by forming the dielectric films 28, 30. Otherwise dielectric films which transmit light of a $\lambda 1$-wavelength and are non-reflective to light of a $\lambda 2$-wavelength may be formed on the end surfaces of the optical transmission region B.

In the case that the semiconductor laser of the optical transmission region B is provided by a refractive index matching distributed feedback semiconductor laser, and the diffraction grating has no phase shifts, a dielectric film having a 1–10% reflectivity for λ1-wavelength light may be formed. In the case that diffraction grating has phase shifts, a dielectric film having a 0–2% reflectivity for λ1-wavelength light may be formed. In the case that the semiconductor laser of the optical transmission region B is provided by a refractive index matching distributed feedback semiconductor laser, and its diffraction grating has phase shifts, the same dielectric film having a 0–2% reflectivity for λ1-wavelength light has to be formed also on the opposed end surface. It is possible that a dielectric film having a definite reflectivity for about λ1-wavelength light and λ2-wavelength light is formed on the opposite end surface so as to lower a laser oscillation threshold value, photofeedbacks necessary for the laser oscillation, and reflect that of input light which has failed to be diffracted is again diffracted to increase an absorbed amount of light. In the case that the semiconductor laser of the optical transmission region B is provided by a gain matching distributed feedback semiconductor, a dielectric film having a 0–90% reflectivity for a wavelength λ1-wavelength may be formed.

In the case that the optical transmission region B is provided by a distributed reflection one-side distributed reflector, a dielectric film having a reflectivity of 10% to 50% for λ1-wavelength light may be formed. In the case that the semiconductor laser of the optical transmission region B is provided by a distributed reflection both-sides distributed reflector, a dielectric film having a reflectivity of 0% to 2% for λ1-wavelength light may be formed.

The active layer 20 of the optical transmission and reception device according to the present embodiment is of bulk type, but may have a single-layer structure, multi-layer quantum-well structure, quantum-wire for one-dimensional structure, or quantum-dot for zero-dimensional structure. The active layer 20 may have a period gain-structure having gain mediums only at loops of standing waves of light in the resonator.

Other semiconductor electronic circuits for respectively driving the optical reception region A and the optical transmission region B, and electronic devices may be integrated on one and the same substrate. The integration may be of monolithic, flip chip or bonding type.

The materials of the semiconductor used in the transmission and reception device according to the present embodiment are InP/GaInAsP-based compound semiconductors for 1–1.7 μm-oscillated wavelength and received wavelength. The material of the optical reception region A may be InGaAsP/InGaSb-based compound semiconductors. For 0.6–1.0 μm-oscillated wavelength and received wavelength, GaAs/AlGaAs/InGaAs or GaAs/InGaAlP/InGaP-based compound semiconductors are used. For 0.6–1.0 μm-oscillated wavelength and received wavelength, the optical transmission region B formed of GaAs/InGaAlP/InGaP-based compound semiconductors on a Si substrate, and the optical reception region A may be provided by a Si-based light detecting device.

The light absorbing layer of the optical transmission and reception device according to the present embodiment is of bulk type, but may be a single-layer, multi-layer quantum-well, quantum-wire or quantum-dot structure.

Since the optical transmission and reception device according to the present embodiment has thus not only an optimum structure for a transmitter, but also an optimum structure for a receiver, high efficiency of converting received light to an electric amount can be obtained. Dark currents can be decreased. Because of an increased volume of the light absorbing layer, the efficiency of converting received light to an electric amount can be raised.

The optical transmission and reception device according to a second embodiment of the present invention will be explained with reference to FIG. 5.

The optical transmission and reception device according to the second embodiment is characterized by the configuration of the diffraction grating 16. That is, the diffraction grating 16 of the optical reception and transmission device according to the present embodiment is a chirped grating whose period is continuously shortened from the end for light to be inputted toward the other end. The members of the second embodiment except the diffraction grating are the same as those of the first embodiment and are indicated by the same reference numerals not to repeat their explanation.

Figure 5:
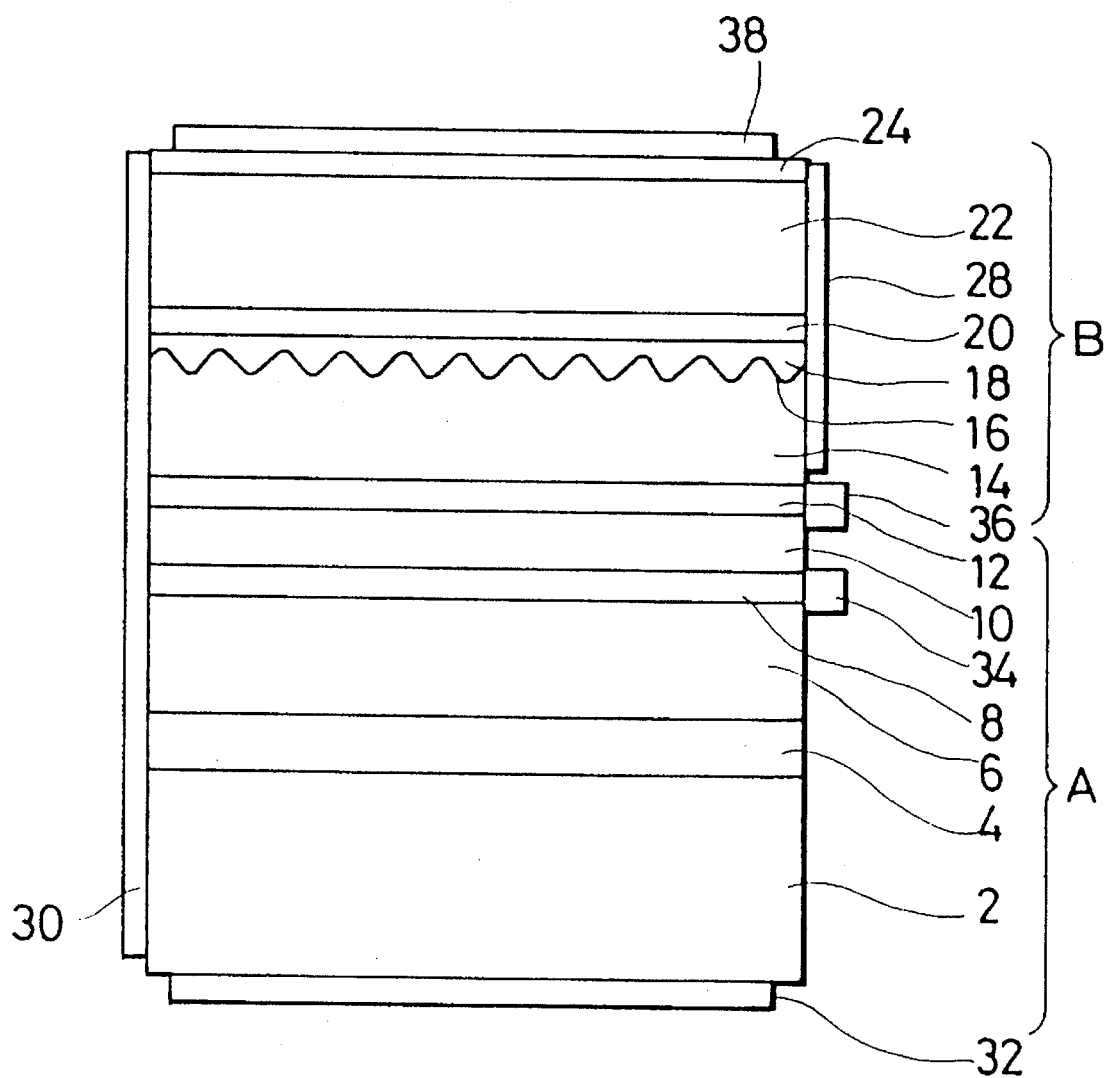
FIG. 5 is a view of the optical transmission and reception device according to a second embodiment of the present invention.

In FIG. 5, the constituents members of a optical reception region A from an n-InP substrate 2 to a contact layer 12, and the constituent members of a optical transmission region B from the contact layer 12 to a contact layer 24 have the same reference numerals as in the first embodiment, and their explanation is not repeated.

In the transmission and reception device according to the second embodiment as well, a bias voltage is applied between the electrodes 36, 38 and without a bias voltage between the electrodes 32, 34, the optical transmission region B alone is driven so that the device functions as a semiconductor laser. On the other hand, with a bias voltage applied between the electrodes 32, 34, and without a bias voltage applied between the electrodes 36, 38, the optical reception region A alone is driven so that light of a λ2-wavelength light inputted to the active layer is diffracted by the diffraction grating 16 to be guided to the light absorbing layer 4, and the optical reception region A functions as a receiver.

The diffraction grating period Λ of the diffraction grating 16 of the optical transmission and reception device according to the second embodiment is formed so as to satisfy the formulas (1) and (2) at the central position of the active layer 20. The diffraction grating period ζ is longer toward the end for light to be inputted and is shorter toward the opposite end. Such configuration of the diffraction grating changes a diffraction angle of input light of a λ2-wavelength to guide the input light to the central part of the light absorbing layer 4, so that a light signal can be thus efficiently converted to an electric signal.

Since the optical transmission and reception device according to the present embodiment as well as the first embodiment has, as described above, not only an optimum structure for a transmitter, but also an optimum structure for a receiver, high efficiency of converting received light to an electric amount can be obtained. Dark currents can be decreased. A volume of the light absorbing layer is increased, and a grating constant of the diffraction grating is continuously changed, thus the efficiency of converting received light to an electric amount can be raised.

Figure 6:
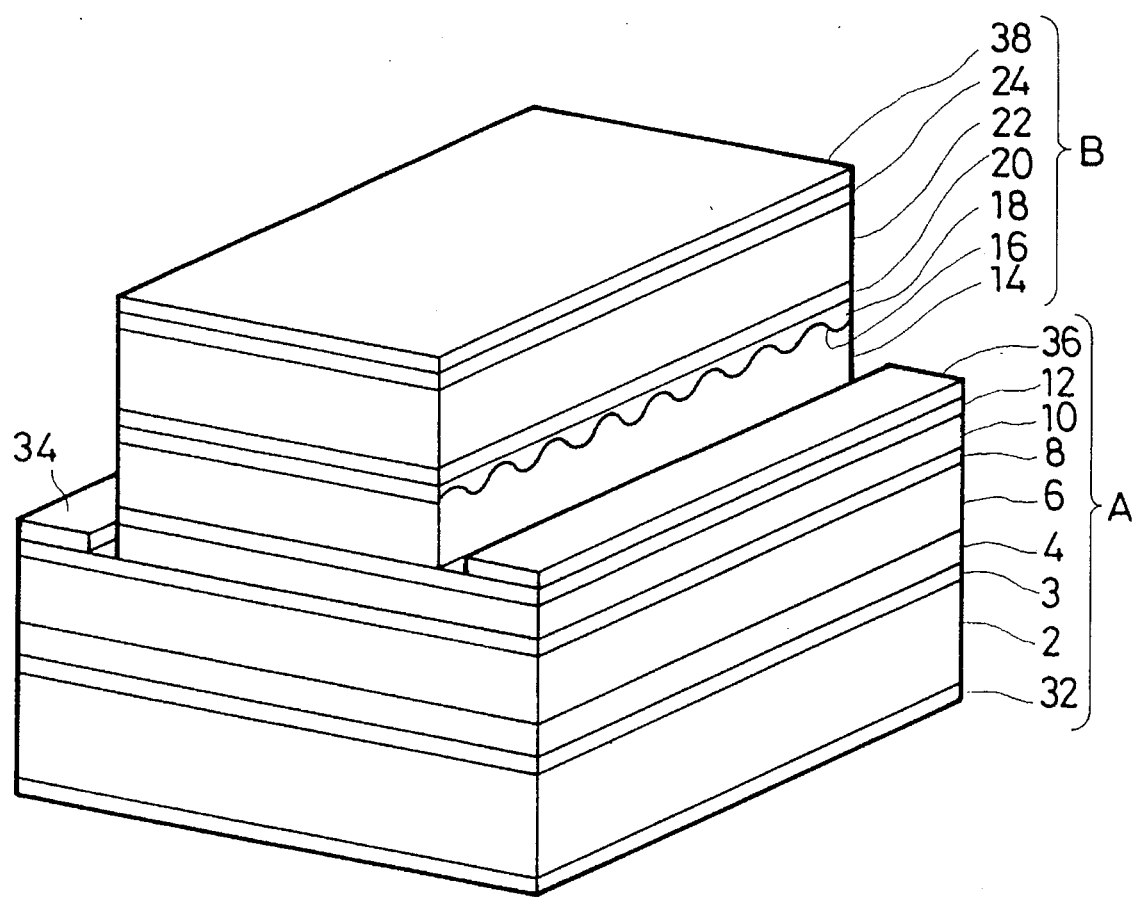
FIG. 6 is a view of the optical transmission and reception device according to a third embodiment of the present invention.

The transmission and reception device according to a third embodiment of the present invention will be explained with reference to FIG. 6.

The transmission and reception device according to the third embodiment has a optical reception region A of the same structure as that of the transmission and reception device according to the first embodiment, and is characterized in that a optical transmission region B is provided by planar waveguide laser. The optical transmission region B is a Fabry-Perot semiconductor laser and includes a stripe waveguide light emitting region. The optical reception region A is provide by a PIN photo-diode. Dielectric films formed on the end surfaces are not described.

An InGaAs layer or an InGaAsP light absorbing layer 4 is formed on an n-InP substrate 2 with an n-InP buffer layer 3 therebetween. A p-InP layer 6 is formed on the light absorbing layer 4. A p-InGaAsP contact layer 8 is formed on the p-InP layer 6. An SI-InP layer 10 is formed on the contact layer 8. A p-InGaAsP contact layer 12 is formed on the SI-InP layer 10. A p-InP clad layer 14 is formed on the contact layer 12. A p-InGaAsP guide layer 18 is formed on the p-InP clad layer 14. A diffraction grating 16 for diffracting received light is formed on the interface between the clad layer 14 and the guide layer 18. An i-InGaAsP active layer 20 is formed on the guide layer 18.

An n-InP clad layer 22 is formed on the active layer 20, and an n-InGaAsP contact layer 24 is formed on the clad layer 22.

An electrode 32 is formed on the underside of the n-InP substrate 2, and respective electrodes 34, 36 are formed on the contact layers 8, 12. An electrode 38 is formed on the contact layer 24.

The operation of the optical transmission and reception device according to the present embodiment is the same as that of the optical transmission and reception device according to the first embodiment, and the explanation of the former is omitted.

A method for fabricating the optical transmission and reception device according to the third embodiment will be explained with reference to FIGS. 7A to 7D.

Figure 7A:
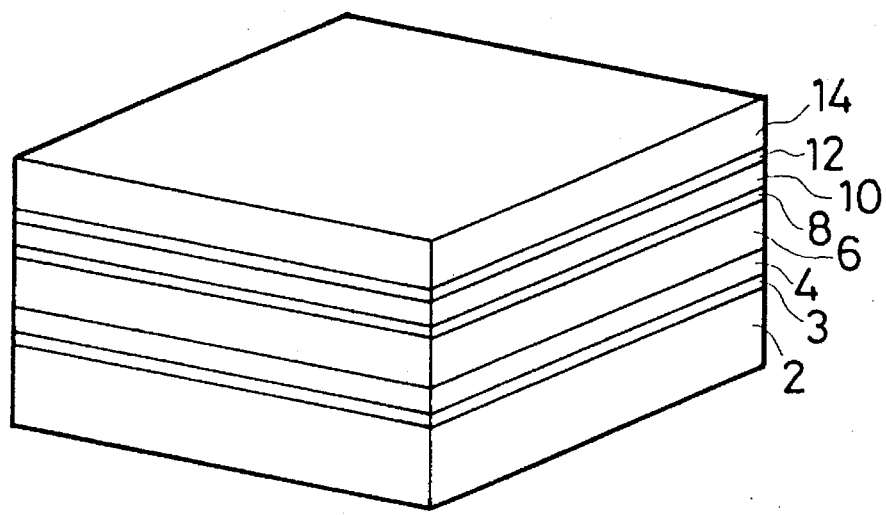
FIGS. 7A–7D are views of steps of a method for fabricating the optical transmission and reception device according to the third embodiment of the present invention.

First, the n-InP buffer layer 3, the InGaAs or InGaAsP light absorbing layer 4 of an about 3.0 μm-thickness, the p-InP layer 6 of an about 3.0 μm-thickness, the p-InGaAsP contact layer 8 of an about 0.3 μm-thickness, the SI-InP layer 10 of an about 0.5 μm-thickness, the p-InGaAsP contact layer 12 of an about 0.3 μm-thickness, and the p-InP clad layer 14 of an about 2.0 μm-thickness are epitaxially grown on the n-InP substrate 2 by, e.g., MOCVD (FIG. 7A).

Figure 7B:
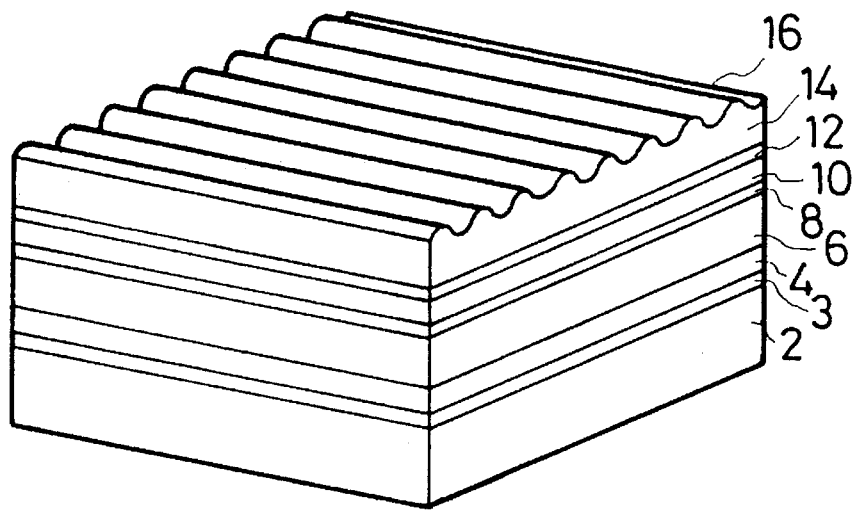

Then, a photoresist layer (not shown) is applied to the surface of the clad layer 14 and is patterned in a diffraction grating pattern by electron-beam exposure or two-beam interference exposure. With the patterned resist layer as the mask, the surface of the clad layer 14 is etched to form the diffraction grating 16 with an about 480 nm-pitch (FIG. 7B).

Then to form the electrode, the left side is etched until the contact layer 8 is exposed. Subsequently the electrode 32 is formed on the underside of the n-InP substrate 2. The electrodes 34, 36 are formed respectively on the exposed contact layers 8, 12, and the electrode 38 is formed on the contact layer 24 (FIG. 7D).

Thus the optical transmission and reception device according to the present embodiment is completed.

Figure 8:
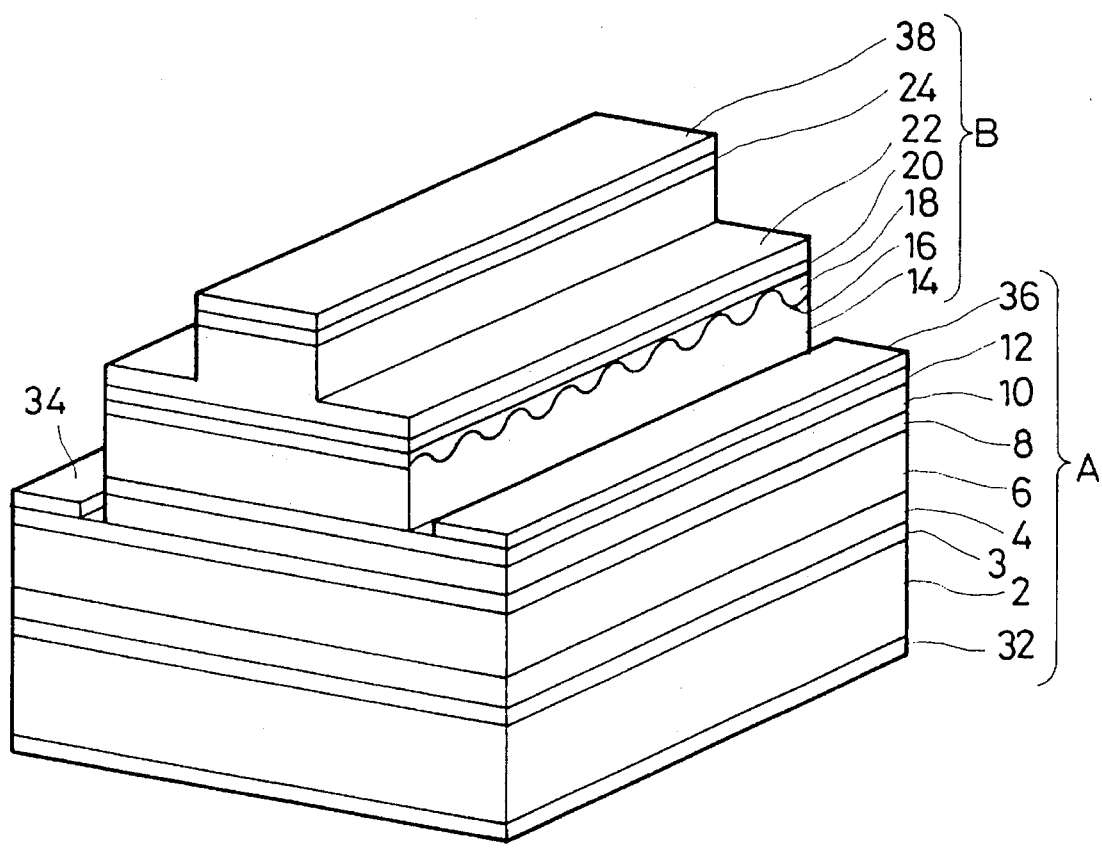
FIG. 8 is a view of the optical transmission and reception device according to a fourth embodiment of the present invention.

The optical transmission and reception device according to a fourth embodiment of the present invention will be explained with reference to FIG. 8.

The optical transmission and reception device according to the fourth embodiment includes a optical reception region A of the same structure as the optical transmission and reception device according to the first embodiment. The present embodiment is characterized in that a optical transmission region B is a ridge-type waveguide laser. The optical transmission region B is provided by a Fabry-Perot semiconductor laser and has a stripe waveguide light emitting region. The optical reception region A is provided by a PIN photo-diode. Dielectric films formed on the side surfaces are not described.

An InGaAs layer or an InGaAsP light absorbing layer 4 is formed on an n-InP substrate 2 with an n-InP buffer layer 3 therebetween. A p-InP layer 6 is formed on the light absorbing layer 4. A p-InGaAsP contact layer 8 is formed on the p-InP layer 6. An Si-InP layer 10 is formed on the contact layer 8. A p-InGaAsP contact layer 12 is formed on the SI-InP layer 10. A p-InP clad layer 14 is formed on the contact layer 12. A p-InGaAsP guide layer 18 is formed on the p-InP clad layer 14. A diffraction grating 16 for diffracting received light is formed on the interface between the clad layer 14 and the guide layer 18. An i-InGaAsP active layer 20 is formed on the guide layer 18.

An n-InP clad layer 22 is formed on the active layer 20, and an n-InGaAsP contact layer 24 is formed on the clad layer 22.

An electrode 32 is formed on the underside of the n-InP substrate 2, and respective electrodes 34, 36 are formed on the contact layers 8, 12. An electrode 38 is formed on the contact layer 24.

A method for fabricating the optical transmission and reception device according to the fourth embodiment of the present invention will be explained below.

Figure 7C:
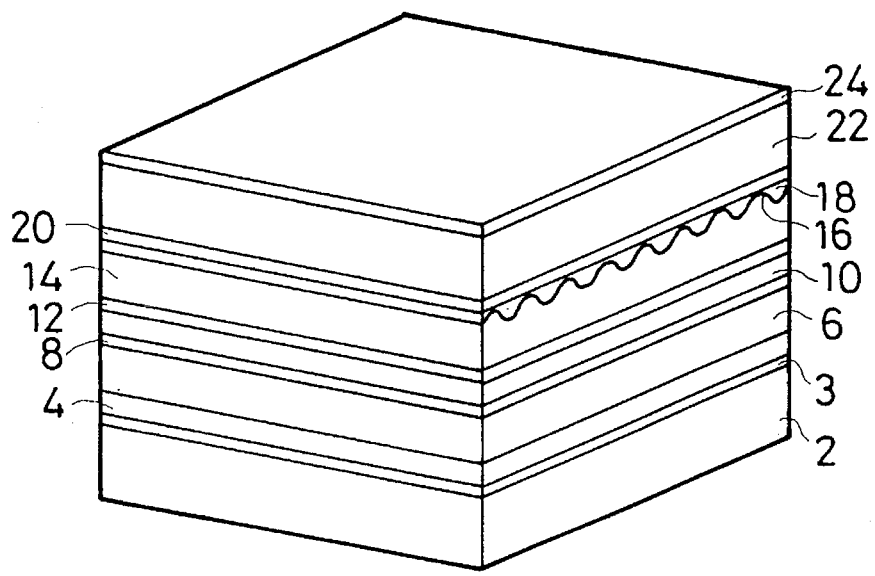
Figure 7D:
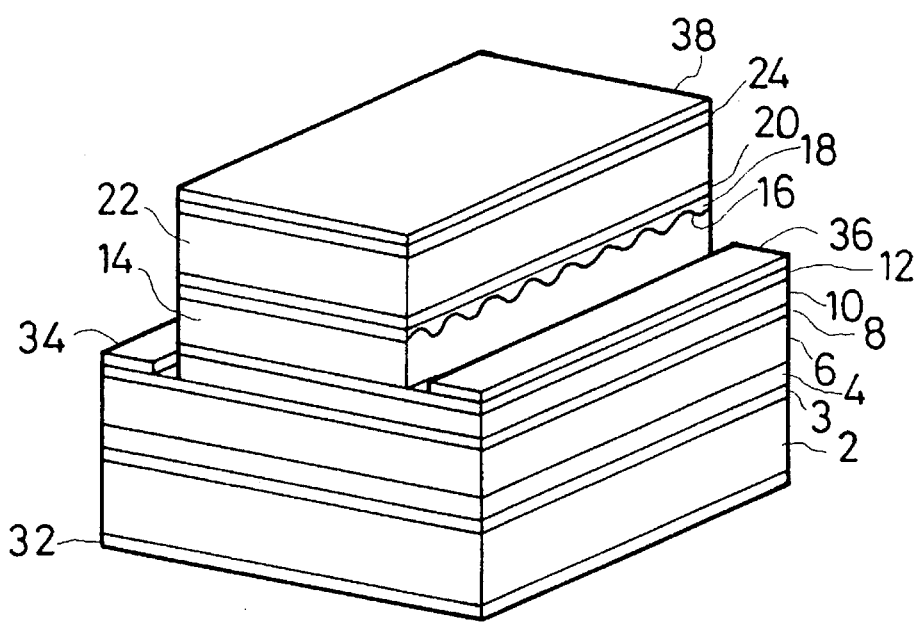

This method is the same as the method for fabricating the optical transmission and reception device according to the third embodiment up to the step of FIG. 7C. The step of FIG. 7C is followed by etching the clad layer 22 up to the middle part to form the central portion into ridges. Then the left side is exposed until the contact layer 8 is exposed, to form the electrode, and the right side is etched until the contact layer 12 is exposed.

Subsequently the electrode 32 is formed on the underside of the n-InP substrate 2. The electrodes 34, 36 are formed respectively on the exposed contact layers 8, 12. The electrode 38 is formed on the contact layer 24 which is the uppermost layer of the ridge-type waveguide laser (FIG. 8).

Thus the optical transmission and reception device according to the fourth embodiment is completed.

Figure 9:
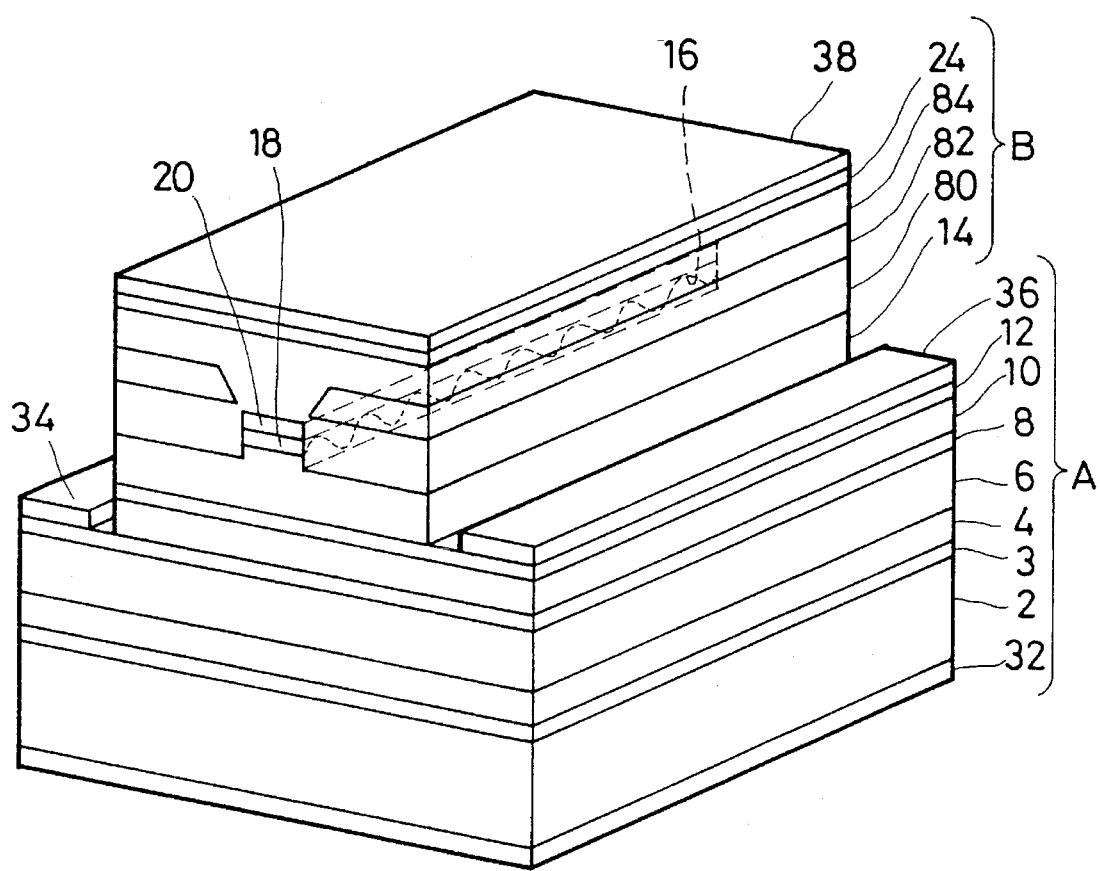
FIG. 9 is a view of the optical transmission and reception device according to a fifth embodiment of the present invention.

The optical transmission and reception device according to a fifth embodiment of the present invention will be explained with reference to FIG. 9.

The optical transmission and reception device according to the fifth embodiment includes a optical reception region A of the same structure as that of the optical transmission and reception device according to the first embodiment, and is characterized in that a optical transmission region B has a buried hetero structure and is provided by a waveguide laser including an pnpn or npnp thyristor current restricting and light confining layer. The optical transmission region B is provided by a Fabry-Perot semiconductor laser, and has a stripe waveguide light emitting region. The optical reception region A is a PIN photo-diode. Dielectric films formed ont the side surfaces are not described.

An InGaAs layer or an InGaAsP light absorbing layer 4 is formed on an n-InP substrate 2 with an n-InP buffer layer 3 therebetween. A p-InP layer 6 is formed on the light absorbing layer 4. A p-InGaAsP contact layer 8 is formed on the p-InP layer 6. An SI-InP layer 10 is formed on the contact layer 8. A p-InGaAsP contact layer 12 is formed on the SI-InP layer 10.

A p-InP clad layer 14 is formed on the contact layer 12. The upper portion of the clad layer 14, and its upper layer is formed in a mesa, and a p-InGaAsP guide layer 18 is formed on the mesa of the clad layer 14. A diffraction grating 16 is formed on the interface between the clad layer 14 and the guide layer 18. An i-InGaAsP active layer 20 is formed on the guide layer 18. The mesa is buried with an n-InP layer 80. A p-InP layer 82 is formed on the n-InP layer 80 except the top of the active layer 20. An n-InP layer 84 which serves as a clad layer is formed on the p-InP layer 82 and the active layer 20. The n-InP layer 80, the p=InP layer 82 and the n-InP layer 84 constitute a current blocking layer. An n-InGaAsP contact layer 24 is formed on the n-InP layer 84.

An electrode 32 is formed on the underside of the n-InP substrate 2, and respective electrodes 34, 36 are formed on the contact layers 8, 12. An electrode 38 is formed on the contact layer 24.

Next, a method for fabricating the optical transmission and reception device according to the fifth embodiment of the present invention will be explained with reference to FIGS. 10A to 10B.

The method for fabricating the optical transmission and reception device according to the fifth embodiment is the same up to the step of FIG. 7C of the method for fabricating the optical transmission and reception device. The step of FIG. 7C is followed by etching the clad layer 14 up to the middle part thereof so as to form the central portion in a mesa (FIG. 10A).

Then the central mesa is buried with the n-Inp layer 80, and the p-InP layer 82 is epitaxially grown on the n-InP layer 80 except the top of the active layer 20. Then the n-InP layer 84 which also functions as a clad layer is epitaxially grown on the p-InP layer 82 and the active layer 20.

Subsequently, to form the electrodes, the left side is etched until the contact layer is exposed, and the right side is etched until the contact layer 12 is exposed.

Then the electrode 32 is formed on the underside of the n-InP substrate 2, and the electrodes 34, 36 are formed respectively on the exposed contact layer 8, 12. The electrode 38 is formed on the central uppermost contact layer 24 (FIG. 10B).

Thus the optical transmission and reception device according to the fifth embodiment is completed.

Figure 11:
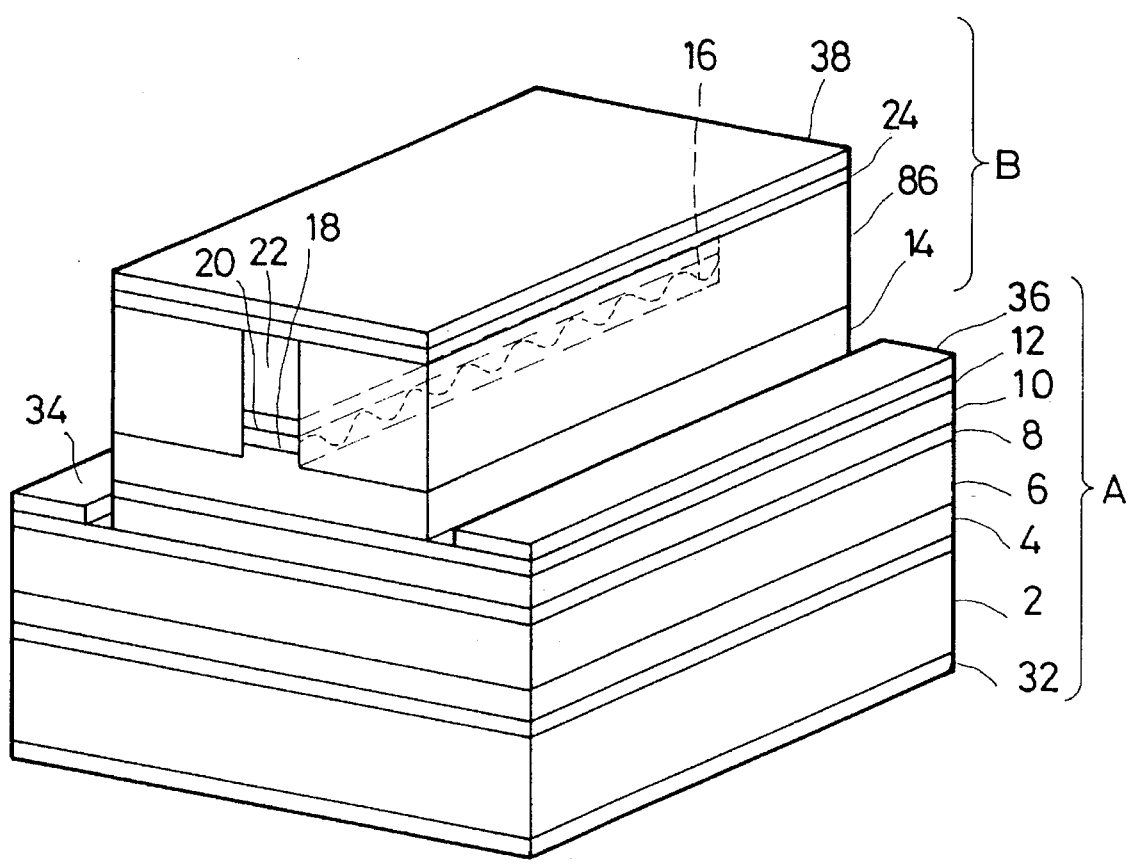
FIG. 11 is a view of the optical transmission and reception device according to a sixth embodiment of the present invention.

The optical transmission and reception device according to a sixth embodiment of the present invention will be explained with reference to FIG. 11.

The optical transmission and reception device according to the sixth embodiment includes a optical reception region A of the same structure as the optical transmission and reception device according to the first embodiment, and is characterized in that a optical transmission region B is of buried type and is provided by a waveguide laser having the structure including a high-resistance semiconductor current restricting and light confining layer. The optical transmission region B is provided by a Fabry-Perot semiconductor laser and includes a stripe waveguide light emitting region. The optical reception region A is provided by a PIN photo-diode. Dielectric films formed on the side surfaces are not described.

An InGaAs or InCaAsP light absorbing layer 4 is formed on an n-InP substrate 2. A p-InP layer 6 is formed on the light absorbing layer 4. A p-InGaAsP contact layer 8 is formed on the p-InP layer 6. An SI-InP layer 10 is formed on the contact layer 8. A p-InGaAsP contact layer 12 is formed on the SI-InP layer 10.

A p-InP clad layer 14 is formed on the contact layer 12. The upper portion of the clad layer 14, and a layer on the top of the upper portion are formed in a mesa. A p-InGaAsP guide layer 18 is formed on the mesa. A diffraction grating 16 for diffracting input light is formed on the interface between the guide layer 14 and the clad layer. An i-InGaAsP active layer 20 is formed on the guide layer 18. An n-InP clad layer 22 is formed on the active layer 20.

The mesa is buried with an SI-InP current blocking layer 86. An n-InGaAsP contact layer 24 is formed on the current blocking layer 86 and the clad layer 22.

An electrode 32 is formed on the underside of the n-InP substrate 2. Respective electrodes 34, 36 are formed on the contact layers 8, 12. An electrode 38 is formed ont the contact layer 24.

A method for fabricating the optical transmission and reception device according to the sixth embodiment of the present invention will be explained.

Figure 10A:
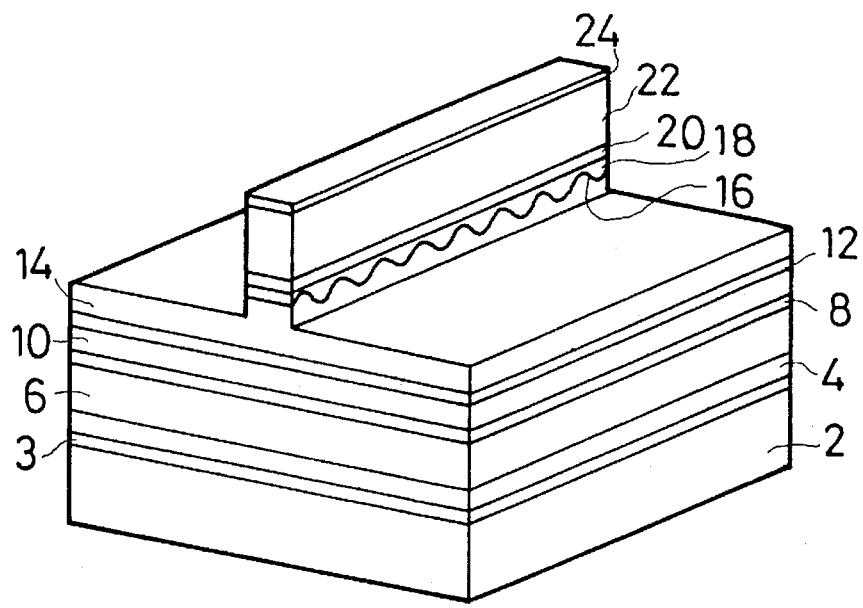
FIGS. 10A–10B are views of steps of a method for fabricating the optical transmission and reception device according to the fifth embodiment of the present invention.
Figure 10B:
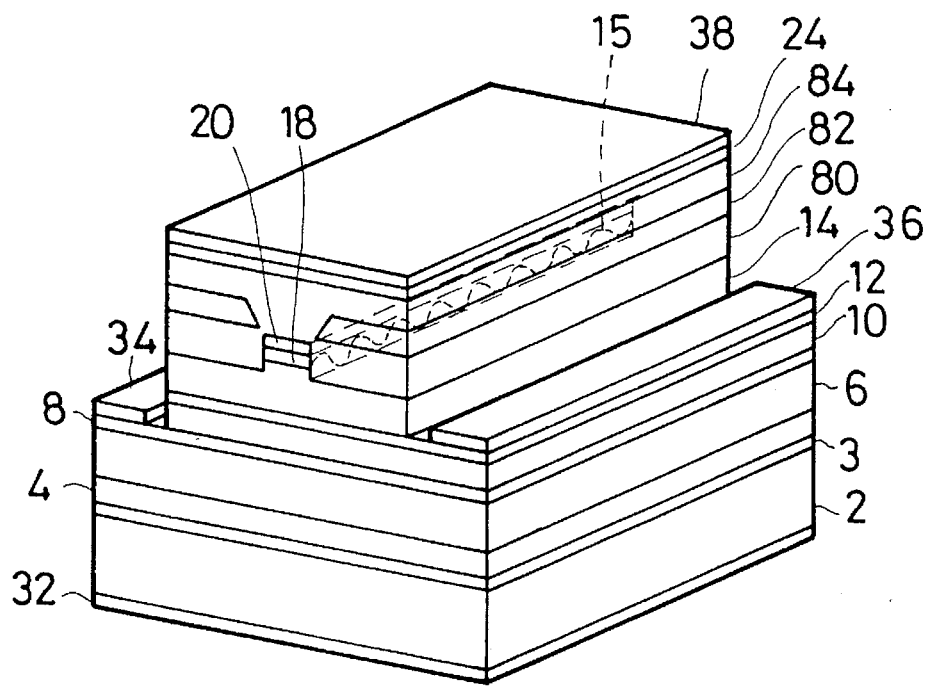

The method for fabricating the optical transmission and reception device according to the present embodiment is the same as the method for fabricating the optical transmission and reception device according to the fifth embodiment up to the step of FIG. 10A. The step of FIG. 10A is followed by burying the central mesa with the current blocking layer 86, and the n-InGaAsP contact layer 24 is formed on the current blocking layer 86 and the clad layer 22.

Then to form electrodes, the left side is etched until the contact layer 8 is exposed, and the right side is etched until the contact layer 12 is exposed.

Then an electrode 32 is formed on the underside of the n-InP substrate 2. Respective electrodes 34, 36 are formed on the exposed contact layers 8, 12. An electrode 38 is formed on the central uppermost contact layer 24 (FIG. 11).

Thus the optical transmission and reception device according to the sixth embodiment is completed.

An optical transmission and reception device according to a seventh embodiment of the present invention will be explained with reference to FIG. 12.

In comparison with the first embodiment, the optical transmission and reception device according to the present embodiment is characterized in that a optical reception region A is not a PIN photo-diode but an avalanche photo-diode, and in the first embodiment, the light absorbing layer of the optical reception region A is on the same side as the optical transmission region B with respect to the n-InP substrate 2, and is disposed between the optical transmission region B and the n-InP substrate 2, whereas, in the present embodiment, in the present embodiment, a light absorbing layer of a optical reception region A is on the side opposite to the transmission region with respect to a substrate. The structure of the optical transmission and reception device according to the present embodiment will be explained with reference to FIG. 12.

Figure 12:
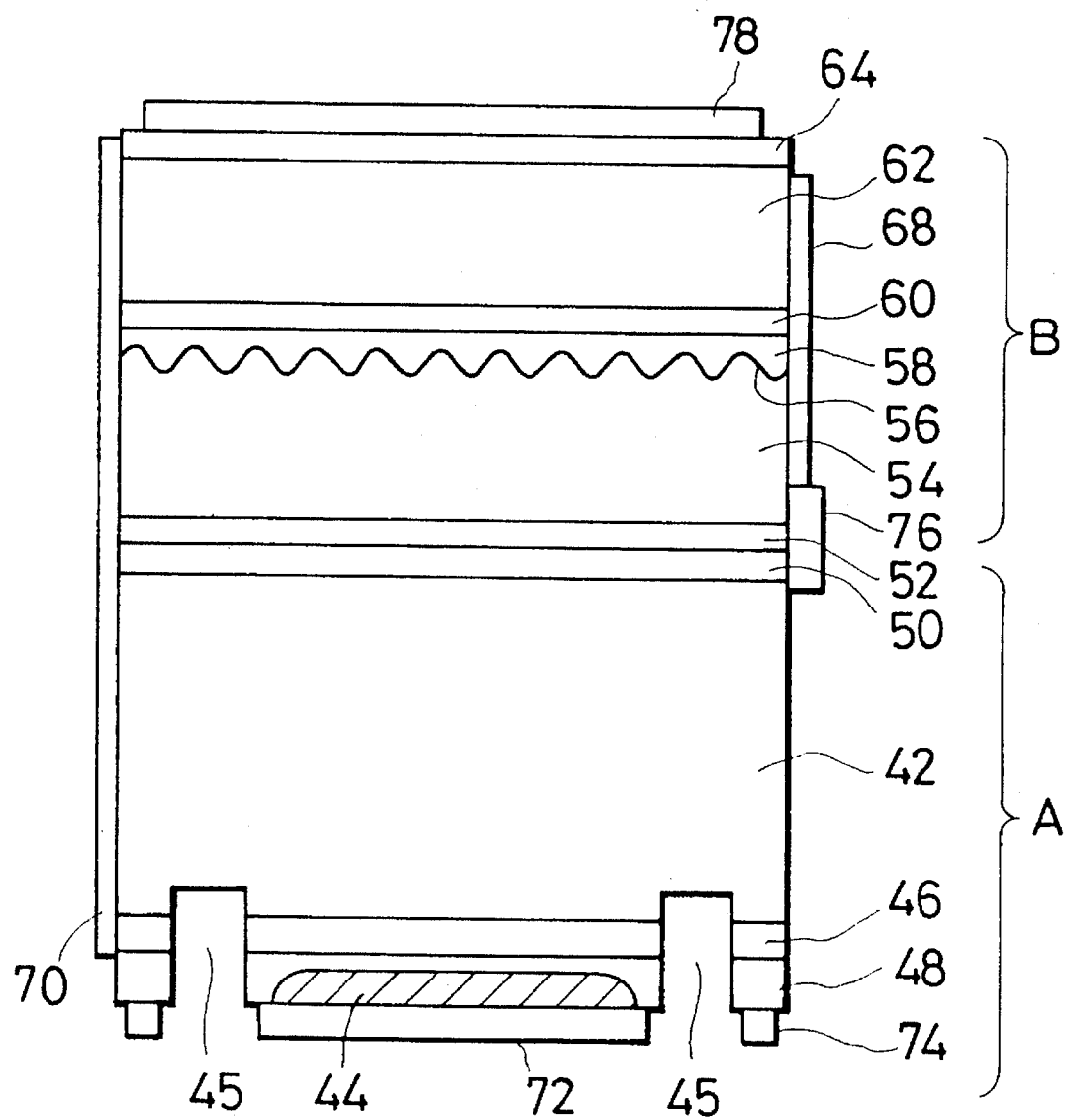
FIG. 12 is a view of the optical transmission and reception device according to a seventh embodiment of the present invention.

An n-InP substrate 42 to a contact layer 48 indicated by A in FIG. 12 is the optical reception region. A contact layer 52 to a contact layer 64 indicated by B in FIG. 12 is the optical transmission region. The optical transmission region B is provided by a Fabry-Perot semiconductor laser, and has a stripe waveguide light emitting region. The optical reception region A is provided by an avalanche photo-diode.

An SI-InP layer 50 is formed on the n-InP substrate 42. An n-InGaAsP contact layer 52 is formed on the SI-InP layer 10.

An n-InP clad layer 54 is formed on the contact layer 52. An n-InGaAsP guide layer 58 is formed on the clad layer 54. A diffraction grating 56 is formed on the interface between the clad layer 54 and the n-InP guide layer 54. An i-InGaAsP active layer 60 is formed on the guide layer 58.

As described in connection with the first embodiment, the diffraction grating 56 does not function to cause the transmission region to oscillate as a DFB laser, but functions as received light transmitting means for propagating received light as input light which has been received on the active layer 60 to the light absorbing layer 4 on a reception. Thus, the diffraction grating 56 does not diffract transmitted light emitted from the active layer 60 but diffracts received light received in the active layer 60.

This active layer 60 also oscillates laser beams of a wavelength of $\lambda_1=1.31$ μm as transmitted light, and guides received light of a wavelength of $\lambda_2=1.55$ μm as input light. A p-InP clad layer 62 is formed on the active layer 60, and a p-InGaAsP contact layer 64 is formed on the clad layer 62.

An InGaAs or InGaAsP light absorbing layer 46 is formed on the underside of the n-InP substrate 42 opposite to the optical transmission region B, and an n-InP contact layer 48 is formed on the light absorbing layer 46. A Zn-diffused region 44 with Zn (zinc) diffused as a dopant is formed in the central parts of the undersides of the contact layer 48. A groove 45 which reach the n-InP substrate 42 is formed around the Zn-diffused region 44.

A dielectric film 70 is formed on the left side surface as viewed in FIG. 12, and a dielectric film 68 is formed on the right side surface from the clad layer 14 to the contact layer 64. A p-electrode 72 is formed on the contact layer 48 enclosed by the groove 45. An n-electrode 74 is formed on the contact layer 48 outside the groove 45. An electrode 76 is formed on the SI-InP layer 50 and the contact layer 52, and an electrode 78 is formed on the contact layer 64.

Since the optical transmission and reception device according to the present embodiment has thus not only an optimum structure for a transmitter, but also an optimum structure for a receiver, high efficiency of converting received light to an electric amount can be obtained. Dark currents can be decreased. Because of an increased volume of the light absorbing layer, the efficiency of converting received light to an electric amount can be raised.

The optical transmission region B of the optical transmission and reception device according to the present embodiment has the same structure as that of the optical transmission and reception device of FIG. 2 according to the first embodiment. The transmission region of the present embodiment has the same structure as that of the second embodiment of FIG. 5. The optical transmission region B may have the same structure as the optical transmission region B of the third embodiment of FIG. 6, the optical transmission region B of the fourth embodiment of FIG. 8, the region B of the fifth embodiment of FIG. 9, or the optical transmission region B of the sixth embodiment of FIG. 11.

A method for fabricating the optical transmission and reception device according to the seventh embodiment of the present invention will be explained. Three example of the method will be explained with reference to FIGS. 13 to 15. These examples will be explained by means of an example that the optical transmission region B of the present embodiment is provided by a waveguide laser having the same structure as the optical transmission region B of the fifth embodiment.

A first example of the method for fabricating the optical transmission and reception device according to the seventh embodiment will be explained with reference to FIGS. 13A to 13E.

Figure 13A:
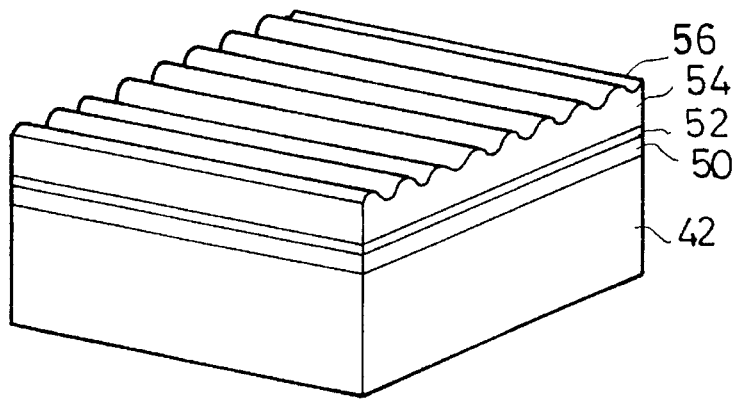
FIGS. 13A–13E are views of steps of a first example of a method for fabricating the optical transmission and reception device according to the seventh embodiment of the present invention.

The SI-InP layer 50, the n-InGaAsP contact layer 52, and the n-InP clad layer 54 are epitaxially formed on the n-InP substrate 42 by, e.g., MOCVD. Then the clad layer 54 is etched to form the diffraction grating 56 (FIG. 13A).

Figure 13B:
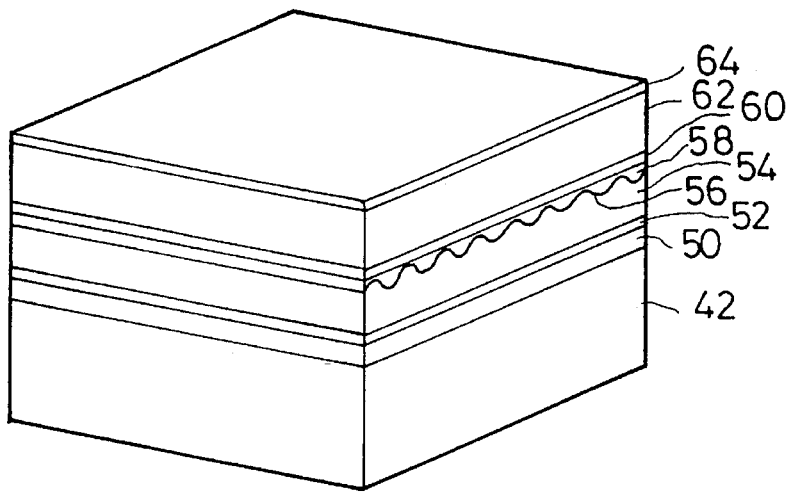

Subsequently the n-InGaAsP guide layer 58, the i-InGaAsP active layer 60, the p-InP clad layer 62 and the p-InGaAsP contact layer 64 are epitaxially formed on the clad layer 54 by, e.g., MOCVD (FIG. 13B).

Then in the same way as the method fabricating the optical transmission and reception device according to the fifth embodiment (FIGS. 10A and 10B), the clad layer 54 is etched up to the middle thereof to form the central portion formed in a mesa.

Then the central mesa is buried with the n-InP layer 100. The p-InP layer 102 is epitaxially grown on the n-InP layer 100 except the active layer 60. Then the n-InP layer 104 which functions as a clad layer is epitaxially grown on the p-InP layer 102 and the active layer 60. Next, the n-InGaAsP contact layer 64 is epitaxially grown on the n-InP layer 104.

Figure 13C:
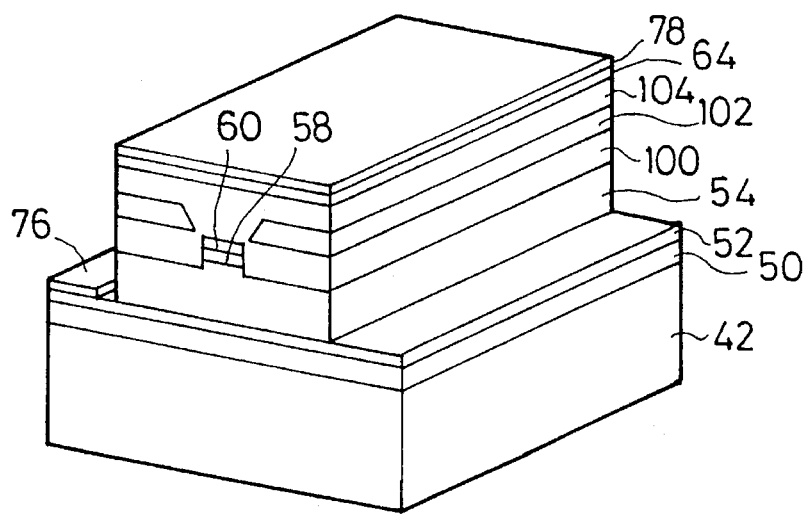

Subsequently, to form electrodes, the left side is etched until the contact layer 52 is exposed, and the right side is etched until the contact layer 12 is exposed. The electrode 76 is formed on the exposed contact layer 52, and the electrode 78 is formed on the central uppermost contact layer 64 (FIG. 13C).

Figure 13D:
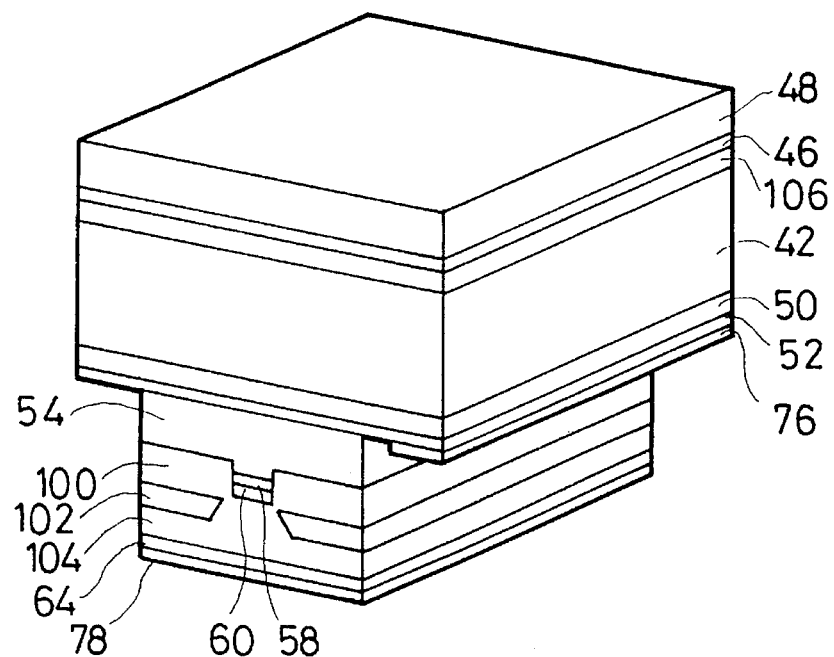

Then, the n-InP buffer layer 106, the InGaAs or InGaAsP light absorbing layer 46 and the n-InP contact layer 48 are formed epitaxially in the stated order on the n-InP substrate 42 by, e.g., MOCVD (FIG. 13D).

Figure 13E:
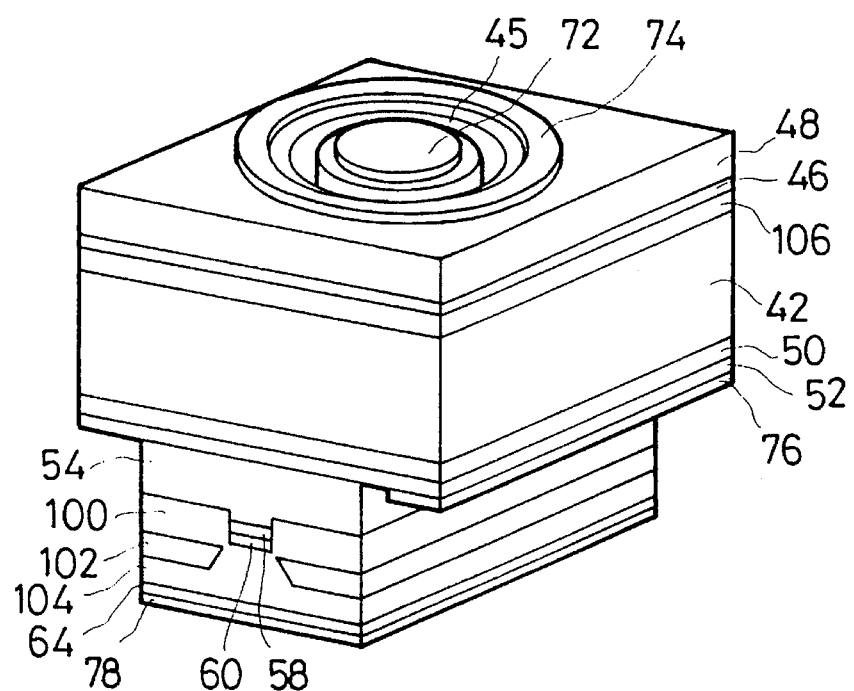

Then Zn, a dopant, is diffused to form the Zn diffused region 44 in the center of the underside of the contact layer 48. A groove 45 which reaches the n-InP substrate 42 is formed around the Zn diffused region 44 (FIG. 13E).

Thus, the optical transmission and reception device according to the present embodiment is completed.

A second example of the method for fabricating the optical transmission and reception device according to the seventh embodiment will be explained with reference to FIGS. 14A to 14E.

In the first example, the optical transmission region B is formed on one surface of the n-InP substrate 42, and then the optical reception region A is formed on the other surface of the n-InP substrate 42. In this example, reversely the optical reception region A is formed on one surface of the n-InP substrate 42, and then the optical transmission region B is formed on the other surface of the n-InP substrate 42.

Figure 14A:
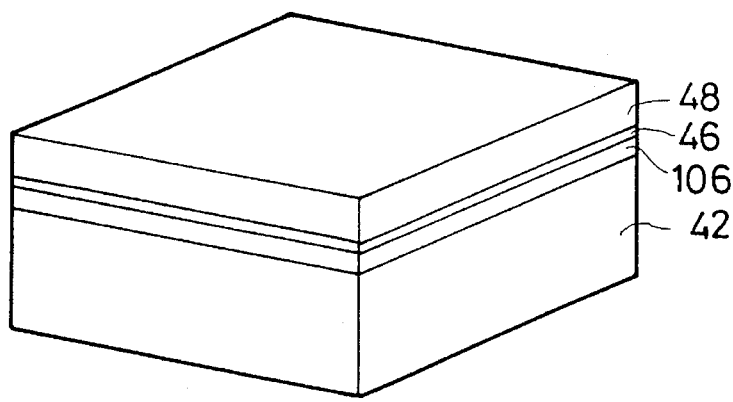
FIGS. 14A–14E are views of steps of a second example of the method for fabricating the optical transmission and reception device according to the seventh embodiment of the present invention.

First, the n-InP buffer layer 106, the InGaAs or InGaAsP light absorbing layer 46, the n-InP contact layer 48 are epitaxially formed one on surface of the n-InP substrate 42 in the stated order by, e.g., MOCVD (FIG. 14A).

Then, Zn, a dopant, is diffused to form the Zn diffused region 44 in the central part of the undersides of the contact layer 48, and a groove 45 which reaches the n-InP substrate 42 is formed around the Zn diffused region 44.

Figure 14B:
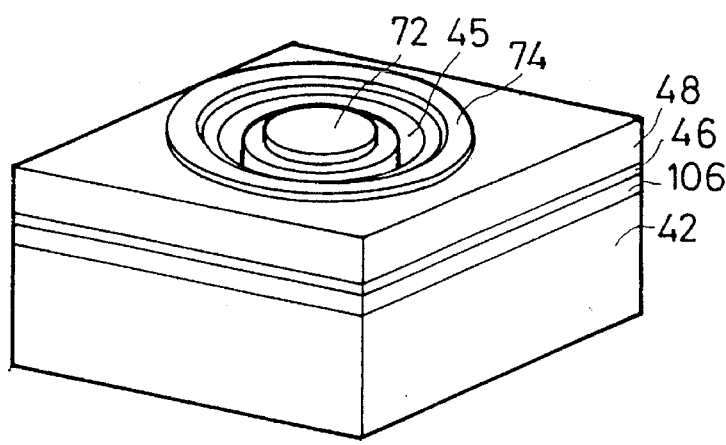

Subsequently the p-electrode 72 is formed on the contact layer 48 enclosed by the groove 45. The n-electrode 74 is formed on the contact layer 48 outside the groove 45 (FIG. 14B).

Figure 14C:
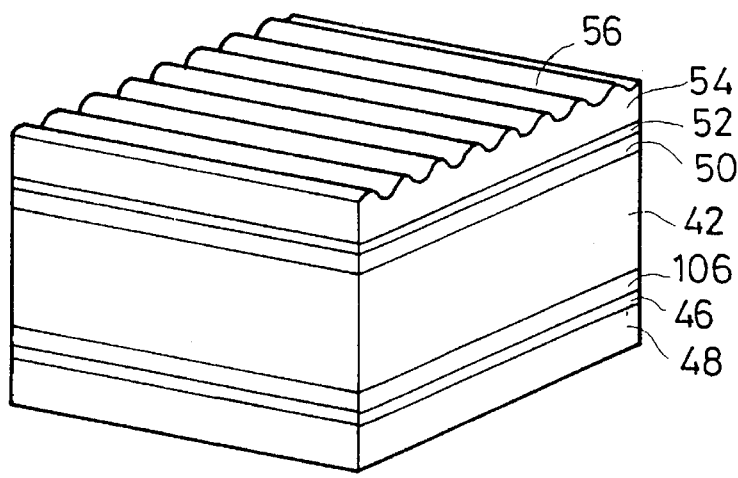

Then, the SI-InP layer 50, the n-InGaAsP contact layer 52, the n-InP clad layer 54 are epitaxially formed on the surface of the n-InP substrate 42 opposite to the optical transmission region B by, e.g., MOCVD. Then the surface of the clad layer 54 is etched to form the diffraction grating 56 (FIG. 14C).

Figure 14D:
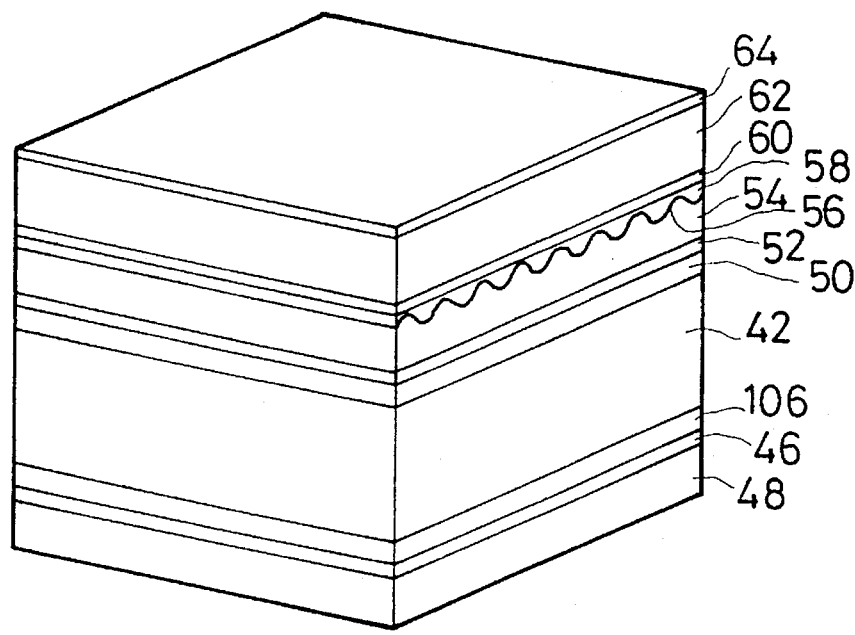

Subsequently the n-InGaAsP guide layer 58, the i-InGaAsP active layer 60, the p-InP clad layer 62, and the p-InGaAsP contact layer 64 are epitaxially formed on the clad layer 54 by, e.g., MOCVD (FIG. 14D).

Then, the clad layer 54 is etched to the middle to form the central part thereof in a mesa. Next, the central mesa is buried with the n-InP layer 100. The p-InP layer 102 is epitaxially grown on the n-InP layer 100 except on the top of the active layer 60. Subsequently the n-InP layer 104 which functions as a clad layer is epitaxially formed on the p-InP layer 102 and the active layer 60.

Figure 14E:
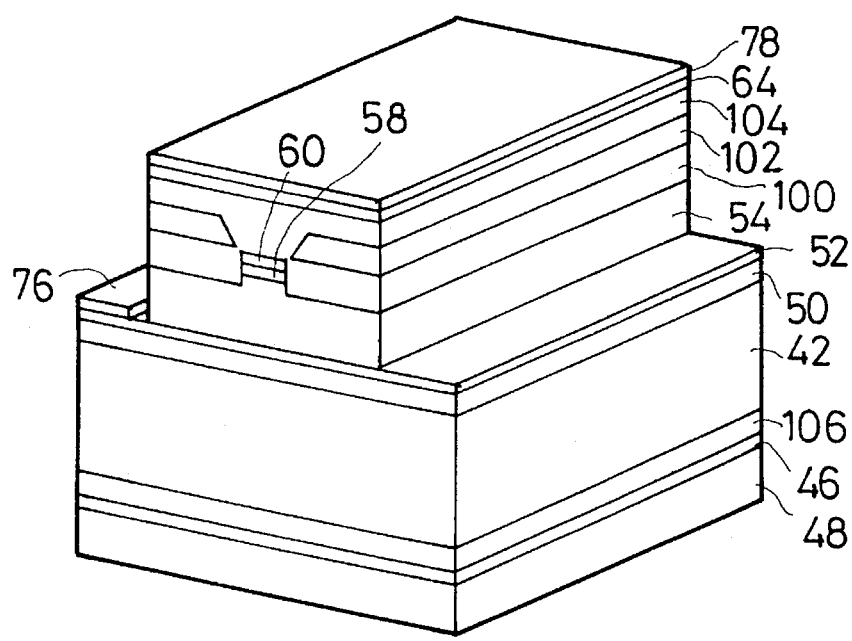

Subsequently, to form the electrodes, the left side is etched until the contact layer 52 is exposed, and the right side is etched until the contact layer 12 is exposed. Then the electrode 76 is formed on the exposed contact layer 52, and the electrode 78 is formed on the central uppermost contact layer 64 (FIG. 14E).

Thus the optical transmission and reception device according to the seventh embodiment is completed.

Figure 15:
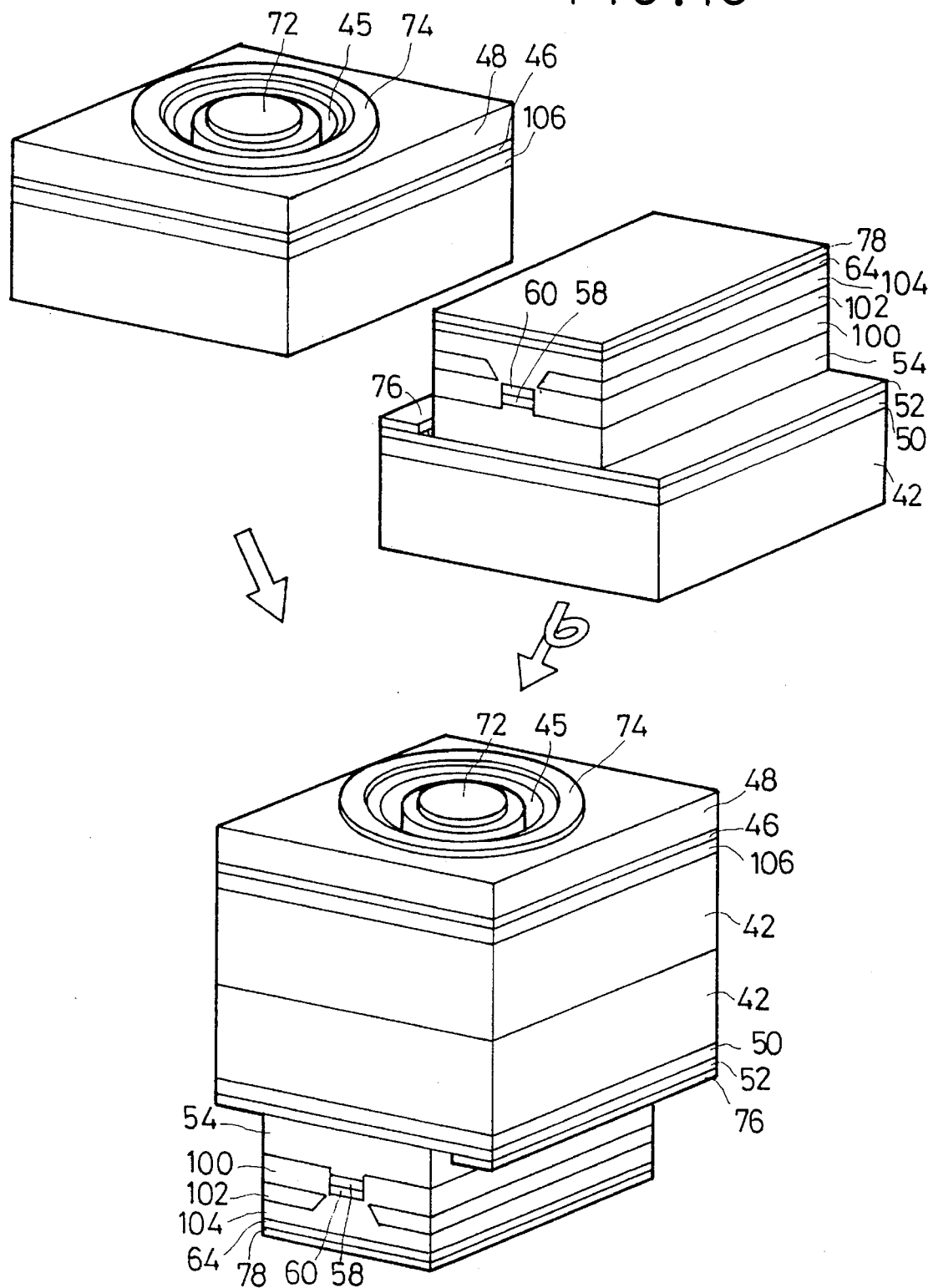
FIG. 15 is a views of a third example of the method for fabricating the optical transmission and reception device according to the seventh embodiment of the present invention.

Next a third example of the method for fabricating the optical transmission and reception device according to the seventh embodiment will be explained with reference to FIG. 15.

In the first and the second examples, the optical reception region A is formed on one surface of the n-InP substrate 42, and the optical transmission region B is formed on the other surface of the n-InP substrate 42. But in this example, the optical transmission and reception device is fabricated by cladding.

As in the first example, a structure with a waveguide laser is formed on an n-InP substrate 42 (FIGS. 13A–13C), and as in the second example, the optical reception region A including a PIN photo-diode is formed on an n-InP substrate 42 (FIGS. 14A–14B).

Subsequently the undersides of the n-InP substrates 42 of the respective structures are speculum-ground, and the undersides are contacted and annealed. Both structures are bonded by an intermolecular force between the undersides of the n-InP substrates of both structures. Thus, an optical transmission and reception device including the optical reception region A formed on one surface of the n-InP substrate 42 and the optical transmission region B formed on the other surface is completed (FIG. 15).

The optical transmission and reception device according to an eighth embodiment of the present invention will be explained with reference to FIGS. 16 to 18.

First, a structure of the optical transmission and reception device according to the present embodiment will be explained with reference to FIG. 16.

Figure 16:
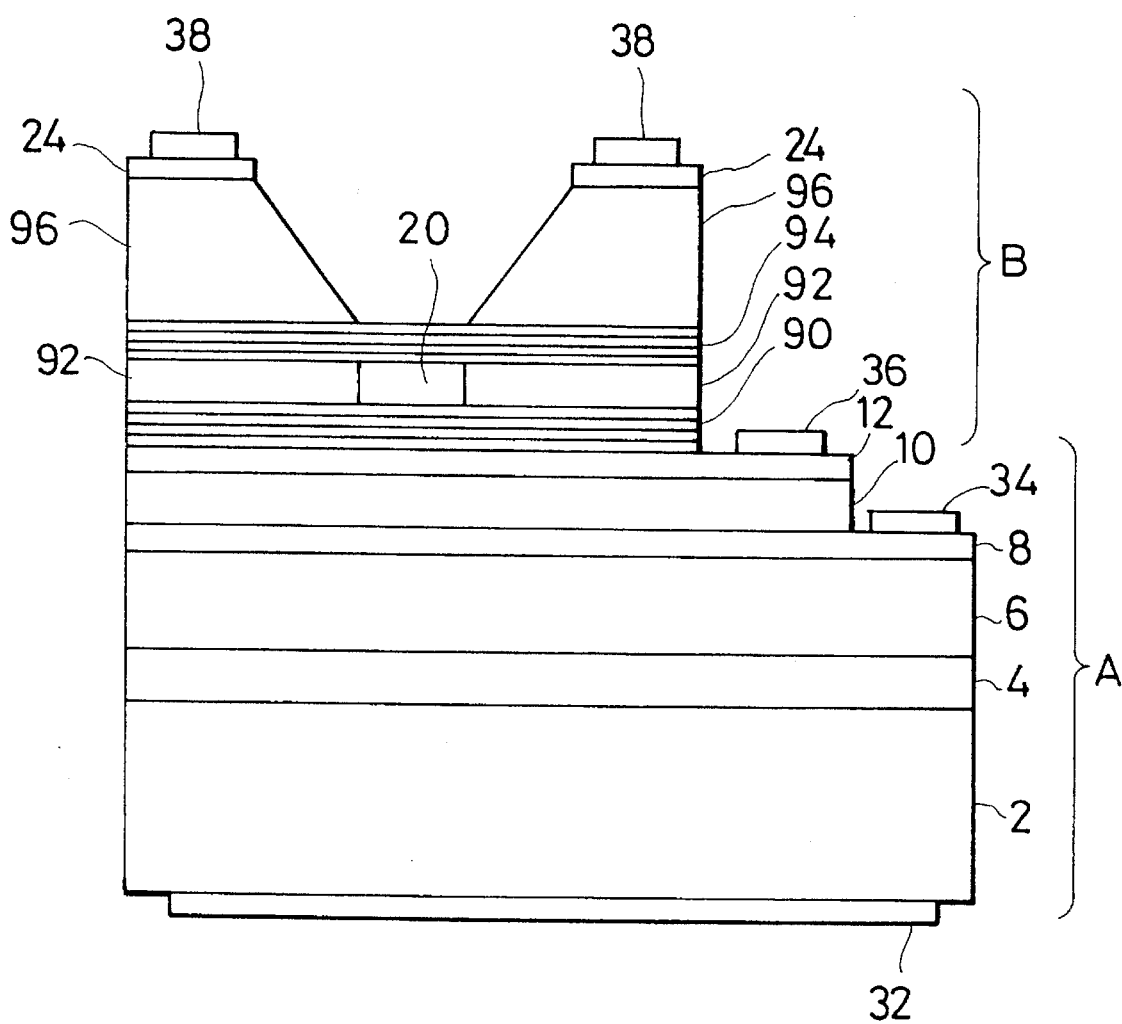
FIG. 16 is a view of the optical transmission and reception device according to an eighth embodiment of the present invention.

An n-InP substrate 2 to a contact layer 12 corresponding to a region indicated by A in FIG. 16 is an optical reception region for detecting received light and converting the received light into electric signals. The contact layer 12 to a contact layer 24 corresponding to a region indicated by B in FIG. 16 is a optical transmission region for, on a transmission, oscillating laser beams and outputting the same as transmitted light, and, on a reception, guiding the received light. The optical transmission region B is a surface light emitting type DBR laser which includes distributed reflection reflectors (DBR mirrors) having a characteristic of reflecting most of λ1-wavelength light but transmitting most of λ2-wavelength light. The optical reception region A is a PIN photo-diode.

An InGaAs or InGaAsP light absorbing layer 4 is formed on the n-InP substrate 2. A p-InP layer 6 is formed on the light absorbing layer 4. A p-InGaAsP contact layer 8 is formed on the p-InP layer 6. An SI-InP layer 10 is formed on the contact layer 8. A p-InGaAsP contact layer 12 is formed on the SI-InP layer 10.

A DBR mirror 90 is formed on the contact layer 12. Two InP layers 92 are formed on the DBR mirror 90. An active layer 20 is formed between the two InP layers 92. Another DBR mirror 94 is formed on the active layer 20 and the InP layers 92.

The active layer 20 oscillates laser beams of a wavelength of λ1=1.31 µm to output the same as transmitted light, and guides received light of a wavelength of λ2=1.55 µm.

Two InP layers 96 are formed on the DBR mirror 94. An opening which is the surface light emitting region and also the light detecting region is formed in the central part of the InP layers 96. An n-InGaAsP contact layer 24 is formed on the InP layer 96. An electrode 32 is formed on the underside of the n-InP substrate 2, and respective electrodes 34, 36 are formed on the contact layers 8, 12. An electrode 38 is formed on the contact layer 24.

The operation of the optical transmission and reception device according to the eighth embodiment will be explained with reference to FIGS. 17 and 18.

Figure 17:
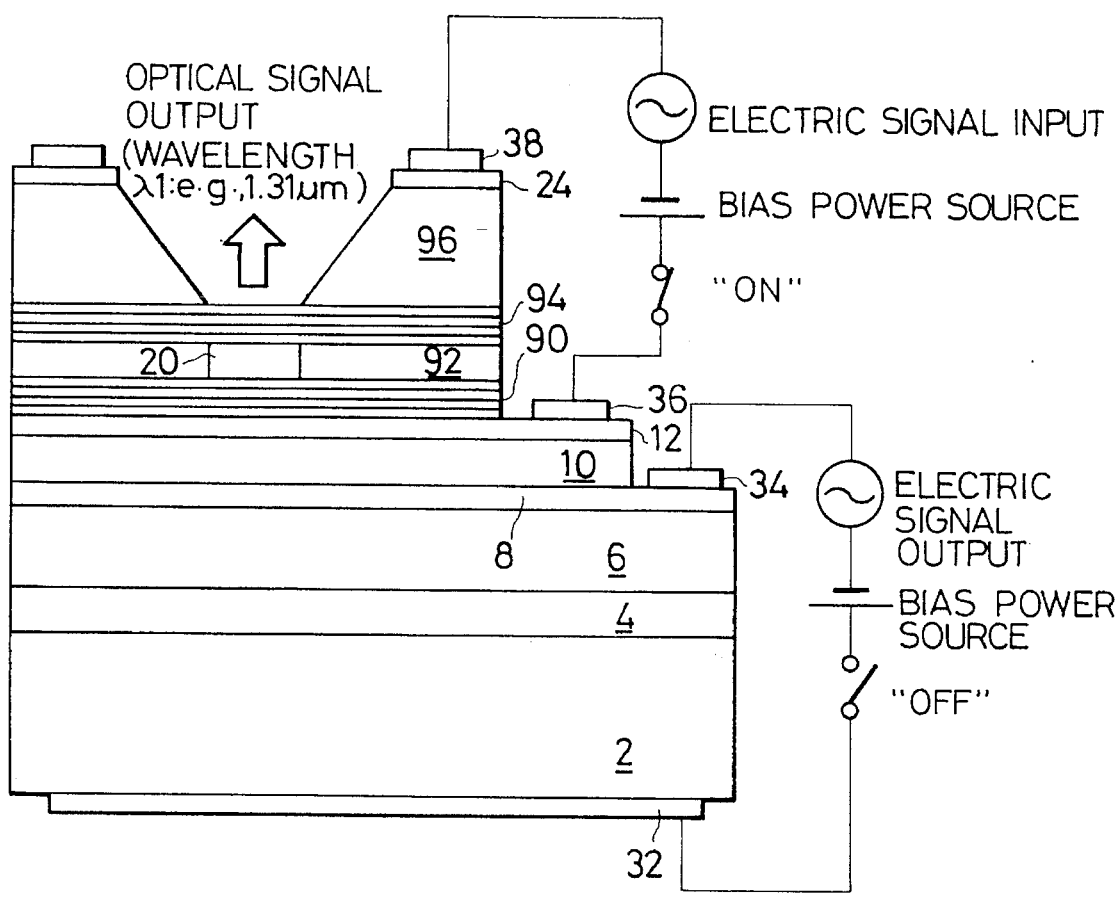
FIG. 17 is an explanatory view of the optical transmitting operation of the optical transmission and reception device according to the eighth embodiment of the present invention.

FIG. 17 explains the operation of the optical transmission and reception device according to the present embodiment as a transmission device.

The optical transmission and reception device according to the present embodiment functions only as a transmission device with a bias voltage applied between the electrodes 36, 38 and without a bias voltage applied between the electrodes 32, 34.

Figure 18:
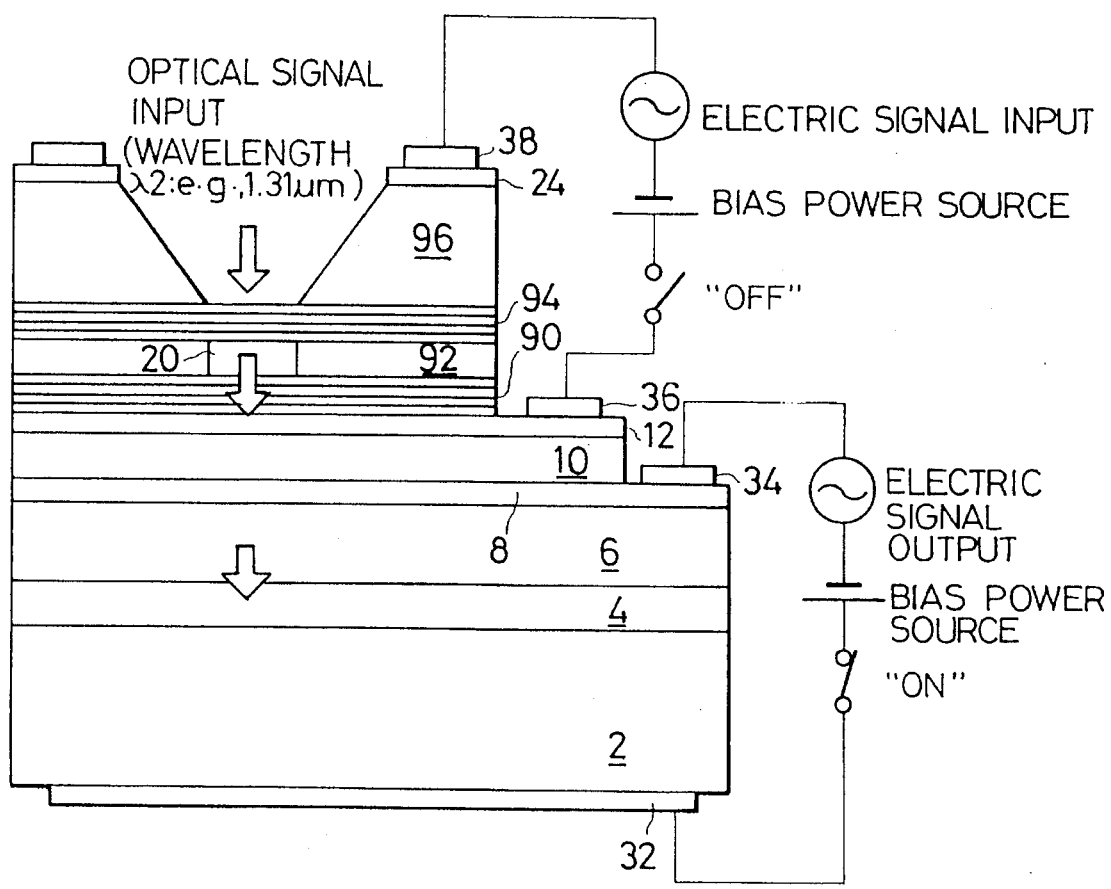
FIG. 18 is a view of the optical receiving operation of the optical transmission and reception device according to the eighth embodiment of the present invention.

FIG. 18 explains the operation of the optical transmission and reception device according to the present embodiment functions only as a receptor device.

Only the optical reception region A is driven with a bias voltage applied between the electrodes 32, 34 and without a bias voltage applied between the electrodes 36, 38, whereby input light of a λ2-wavelength passes the transparent DBR mirror 94, the active layer 20 and the DBR mirror 90 to the light absorbing layer 4 to be converted there into a current or a voltage corresponding to an intensity of the light. Thus the optical transmission and reception device according to the eighth embodiment functions as a receptor.

The optical transmission region B of the optical transmission and receptor device according to the present embodiment is provided by a semiconductor laser including a high-resistance semiconductor current restricting and light confining layer of buried hetero structure, but may be provided by a semiconductor laser including a pnpn or npnp thyristor current restricting and light confining layer.

Since the optical transmission and reception device according to the present embodiment has thus not only an optimum structure for a transmitter, but also an optimum structure for a receiver, high efficiency of converting received light to an electric amount can be obtained. Dark currents can be decreased. Because of an increased volume of the light absorbing layer, the efficiency of converting received light to an electric amount can be raised.

Figure 19A:
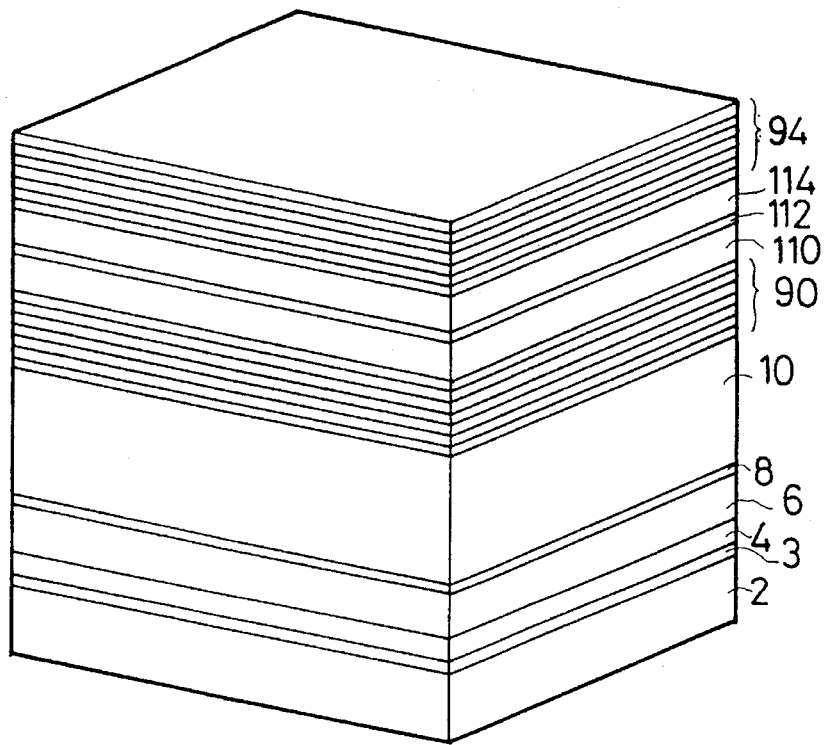
FIGS. 19A–19C are views of steps of a method for fabricating the optical transmission and reception device according to the eighth embodiment of the present invention.

Then a method for fabricating the optical transmission and reception device according to the eighth embodiment of the present invention will be explained with reference to FIGS. 19A to 19C.

The n-InP buffer layer 3, the InGaAs or InGaAsP light absorbing layer 4, the p-InP layer 6, the p-InGaAsP contact layer 8 and the SI-InP layer 10 are epitaxially grown in the stated order on the n-InP substrate 2. The DBR mirror 90 comprising the n-GaAs layer and the n-AlAs layer alternately laid on each other on the SI-InP layer 10, the n-AlGaAs or n-GaAs clad layer 110, the active layer 112 of the i-InGaAs distorted quantum well layer 112, the p-AlGaAs or p-GaAs clad layer 114, and a DBR mirror 94 comprising the p-GaAs layer and the p-AlAs layer alternately laid on each other are epitaxially grown in the stated order (FIG. 19A).

Then to form the electrodes, the DBR mirror 94 is etched until the clad layer 114 is exposed around the DBR mirror 94. Subsequently the right side is etched until the DBR mirror 90 is exposed, and then the right side is etched until the contact layer 8 is exposed.

Figure 19B:
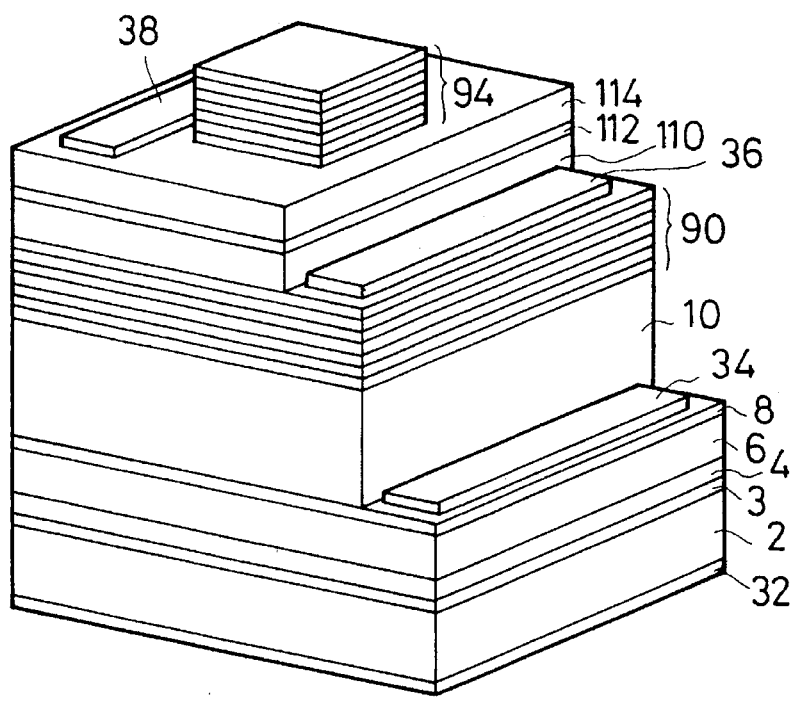

Then, the electrode 32 is formed on the underside of the n-InP substrate 2, the electrode 38 is formed on the exposed clad layer 114, and the electrode 34 is formed on the contact layer 8 (FIG. 19B).

Thus the optical transmission and reception device according to the eighth embodiment is completed.

Figure 19C:
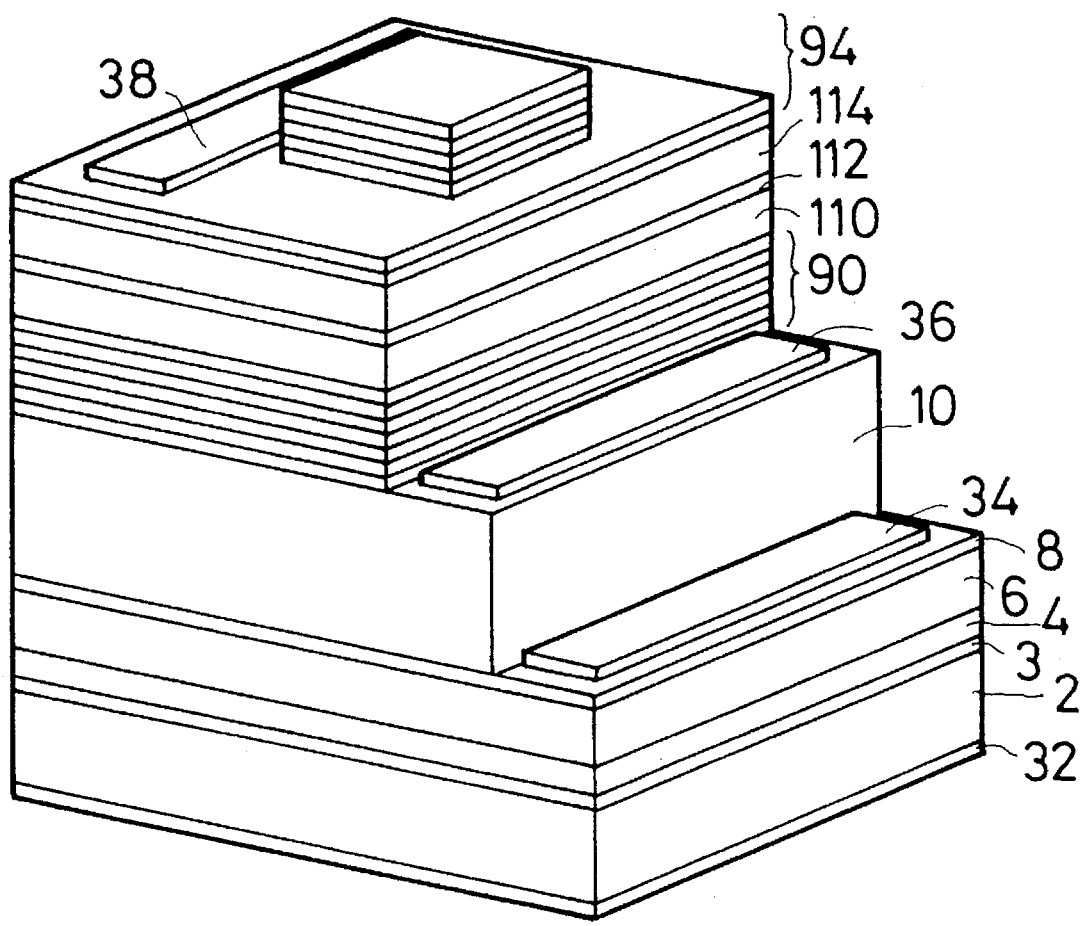

As shown in FIG. 19C, the electrodes 36, 38 may be formed on other layers. To form the electrodes, the periphery of the DBR mirror 94 is etched with the central portion left until the intermediate layers thereof are exposed, and the left side is etched until the SI-InP layer 10 is exposed, and then the right side is etched until the contact layer is exposed.

Then the electrode 32 is formed on the underside of the n-InP substrate 2, and the electrode 38 is formed on intermediate layers of the exposed DBR mirror 94 with a contact layer (not shown) therebetween, the electrode 36 is formed on the SI-InP layer 10 with a contact layer (not shown) therebetween, and the electrode 34 is formed on the contact layer 8 (FIG. 19C).

The optical transmission and reception device according to a ninth embodiment of the present invention will be explained with reference to FIG. 20.

Figure 20:
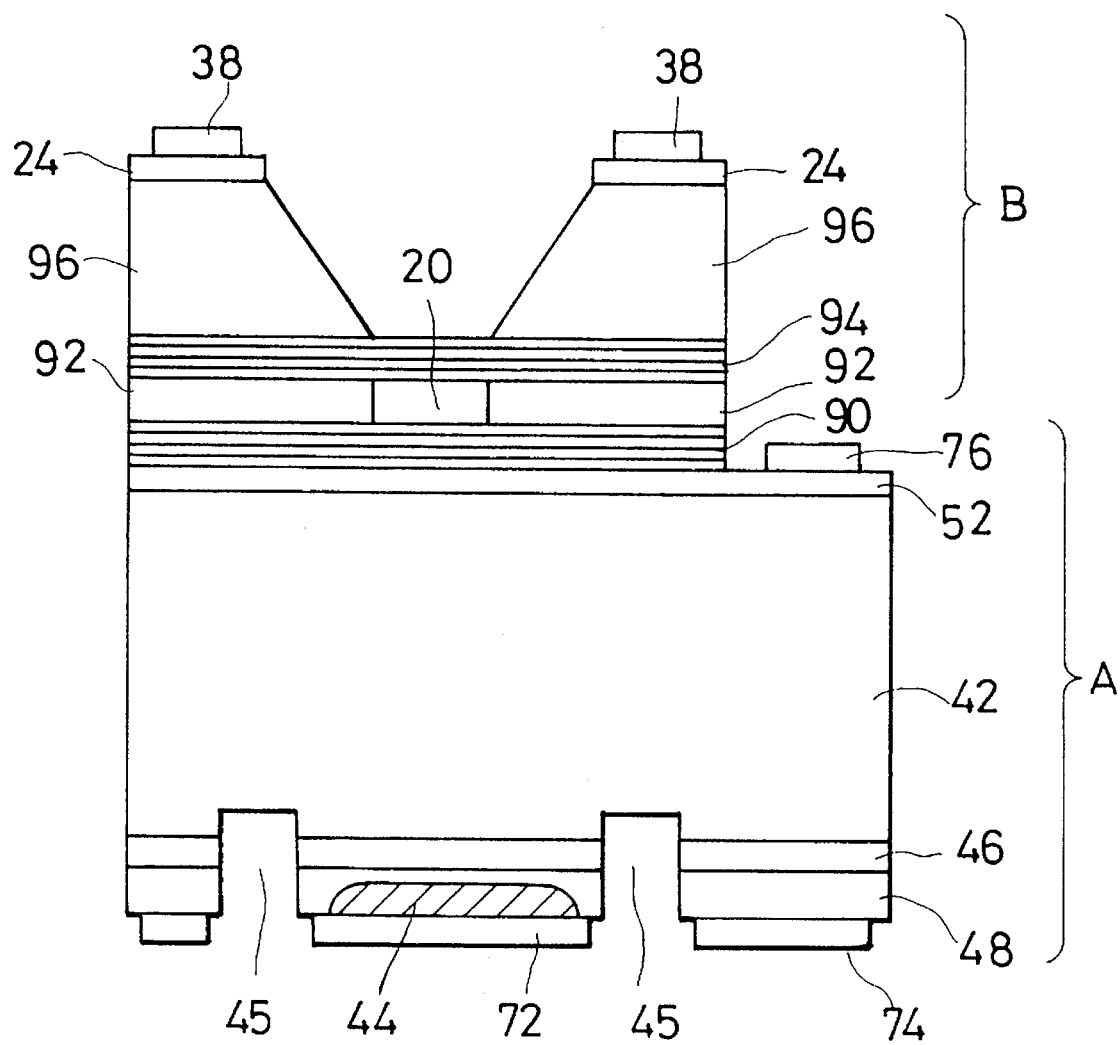
FIG. 20 is a view of the optical transmission and reception device according to a ninth embodiment of the present invention.

An n-InP substrate 42 to a contact layer 48 corresponding to a region indicated by A in FIG. 20 is an optical reception region for detecting received light and converting the received light into electric signals. A DBR mirror 90 to a contact layer 24 corresponding to a region indicated by B in FIG. 20 is a optical transmission region for, on a transmission, oscillating laser beams and outputting the same as transmitted light, and, on a reception, guiding the received light. The optical transmission region B is provided by a Fabry-Perot semiconductor laser and includes a stripe waveguide light emitting region. The optical reception region A is provided by an avalanche photo-diode.

An n-InGaAs contact layer 52 is formed on the n-InP substrate 42. a DBR mirror 90 is formed on the contact layer 52. Two InP layers 92 are formed on the DBR mirror 90, and an active layer 20 is formed between the two InP layers 92. Another DBR mirror 94 is formed on the active layer 20 and on the InP layer.

This active layer 20 oscillates laser beams of wavelength of $\lambda 1 = 1.31$ μm to output the same as transmitted light, and guides received light of a wavelength of $\lambda 2 = 1.55$ μm.

Two InP layers 96 are formed on the DBR mirror 94, and an opening which is a surface light emitting region and also the light detecting region is formed between the InP layers 96. N type-InGaAsP contact layers 24 are formed on the InP layers 96.

InGaAs or InGaAsP light absorbing layer 46 is formed on the underside of the n-InP substrate 42 opposite to the optical transmission region B, and an n-InP contact layer 48 is formed on the light absorbing layer 46. A Zn diffused region 44 with Zn diffused as a dopant is formed in the central part of the underside of the contact layer 48, and a groove 45 which reaches the n-InP substrate 42 is formed around the Zn diffused region 44.

A p-electrode 72 is formed on the contact layer 48 enclosed by the groove 45, and a n-electrode 74 is formed on the contact layer 48 outside the groove 45. An electrode 76 is formed on the be layer 52, and an electrode 38 is formed on the contact layer 24.

The operation of the optical transmission and reception device according to the ninth embodiment is not described because it is the same as that according to the eighth embodiment.

Since the optical transmission and reception device according to the present embodiment has thus not only an optimum structure for a transmitter, but also an optimum structure for a receiver, high efficiency of converting received light to an electric amount can be obtained. Dark currents can be decreased. Because of an increased volume of the light absorbing layer, the efficiency of converting received light to an electric amount can be raised.

Then a method for fabricating the optical transmission and reception device according to the ninth embodiment of the present invention will be explained. Two kinds of the method will be explained with reference to FIGS. 21 and 22.

A first example of the method for fabricating the optical transmission and reception device according to the ninth embodiment will be explained with reference to FIGS. 21A to 21D.

Figure 21A:
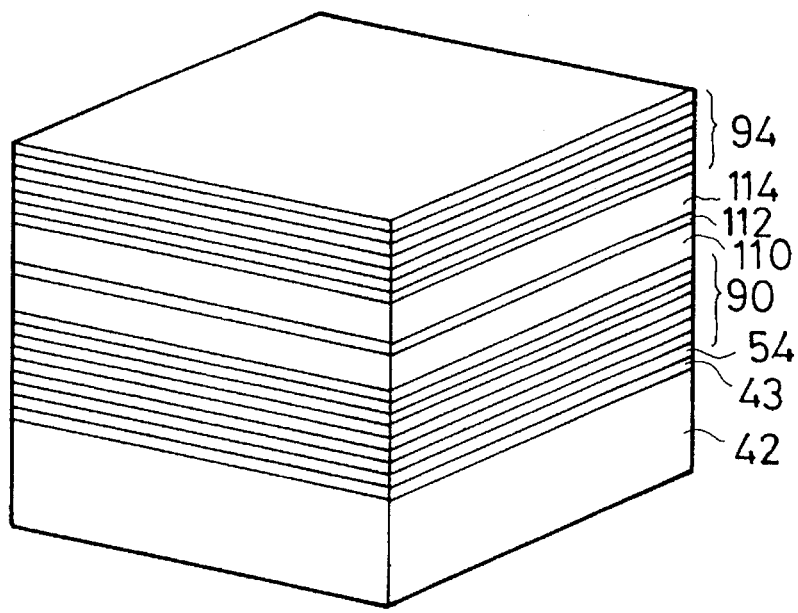
FIGS. 21A–21D are views of steps of a first example of a method for fabricating the optical transmission and reception device according to the ninth embodiment of the present invention.

First, the n-InP buffer layer 43, the contact layer 52, the DBR mirror 90 comprising n-AlGaAs and n-AlAs layers alternately laid on each other, the n-AlGaAs or n-GaAs clad layer 110, the active layer 112 of an i-InGaAs distorted quantum well layer, the p-AlGaAs or p-GaAs clad layer 114, the DBR mirror 94 comprising the p-GaAs layers and p-AlAs layers alternately laid on each other are epitaxially laid on each other (FIG. 21A).

Then to form electrodes the periphery of the DBR mirror 94 is etched with the central portion thereof left until intermediate layers of the DBR mirror 94 are exposed, and then the right side is etched until the contact layer 52 is exposed.

Figure 21B:
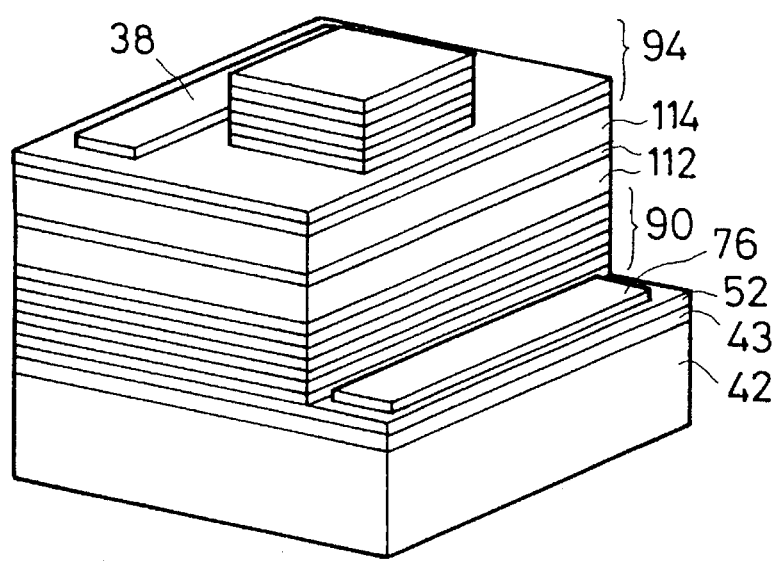

Next, the electrode 38 is formed on the exposed intermediate layers of the DBR mirror 94 with a contact layer (not shown) therebetween, and the electrode 76 is formed on the contact layer 52 (FIG. 21B)

Figure 21C:
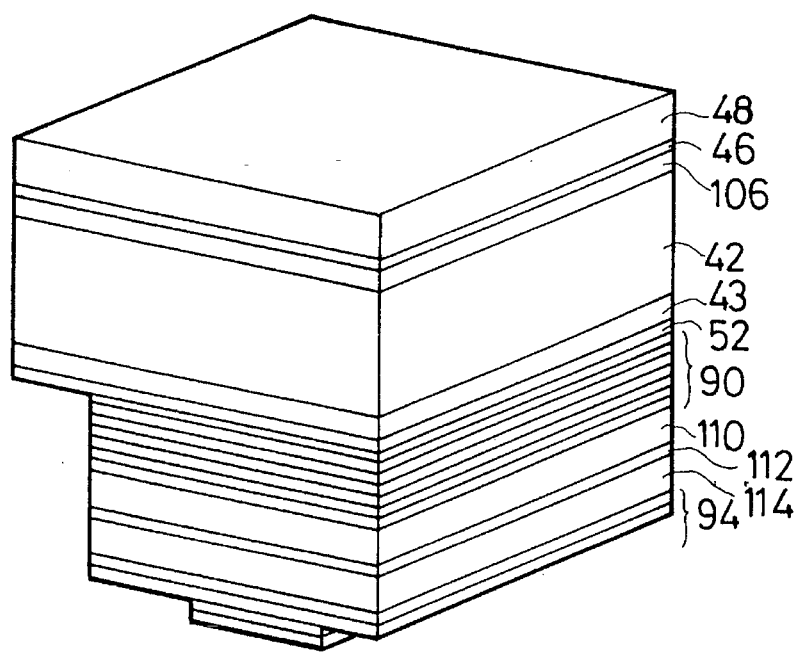

Subsequently the n-InP buffer layer 106, the InGaAs or InGaAsP light absorbing layer 46, the n-InP contact layer 48 are epitaxially grown in the stated order on the underside of the n-InP substrate 42 opposite to the optical transmission region B (FIG. 21C).

A Zn diffused region 44 is formed in the central part of the underside of the contact layer 48 by diffusing a dopant, Zn. A groove 45 is which reaches the n-InP substrate 42 is formed around the Zn diffused region 44.

Figure 21D:
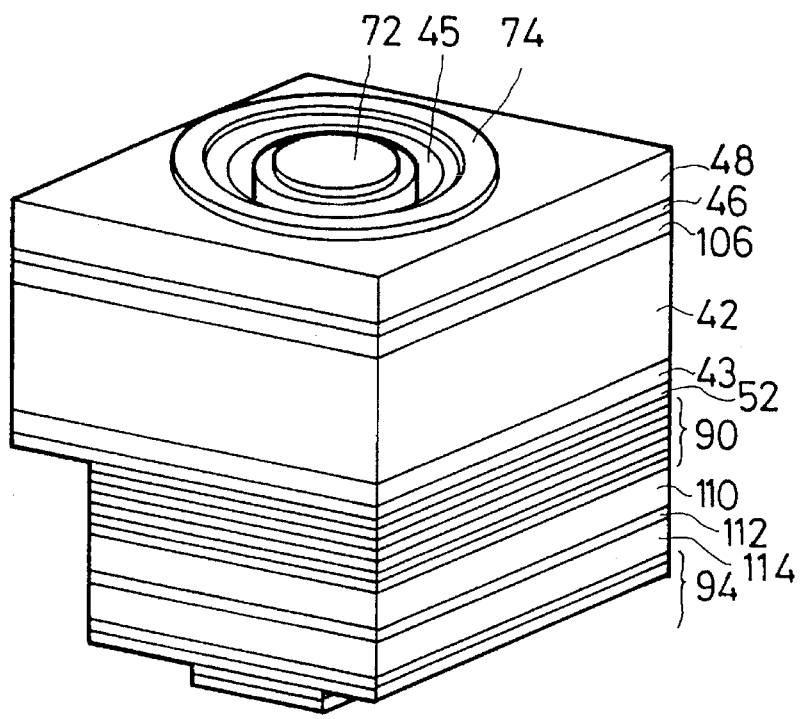

The p-electrode 72 is formed on the contact layer 48 enclosed by the groove 45, and the n-electrode 74 is formed on the contact layer 48 outside the groove 45 (FIG. 21D).

Thus the optical transmission and reception device according to the ninth embodiment is completed.

Figure 22:
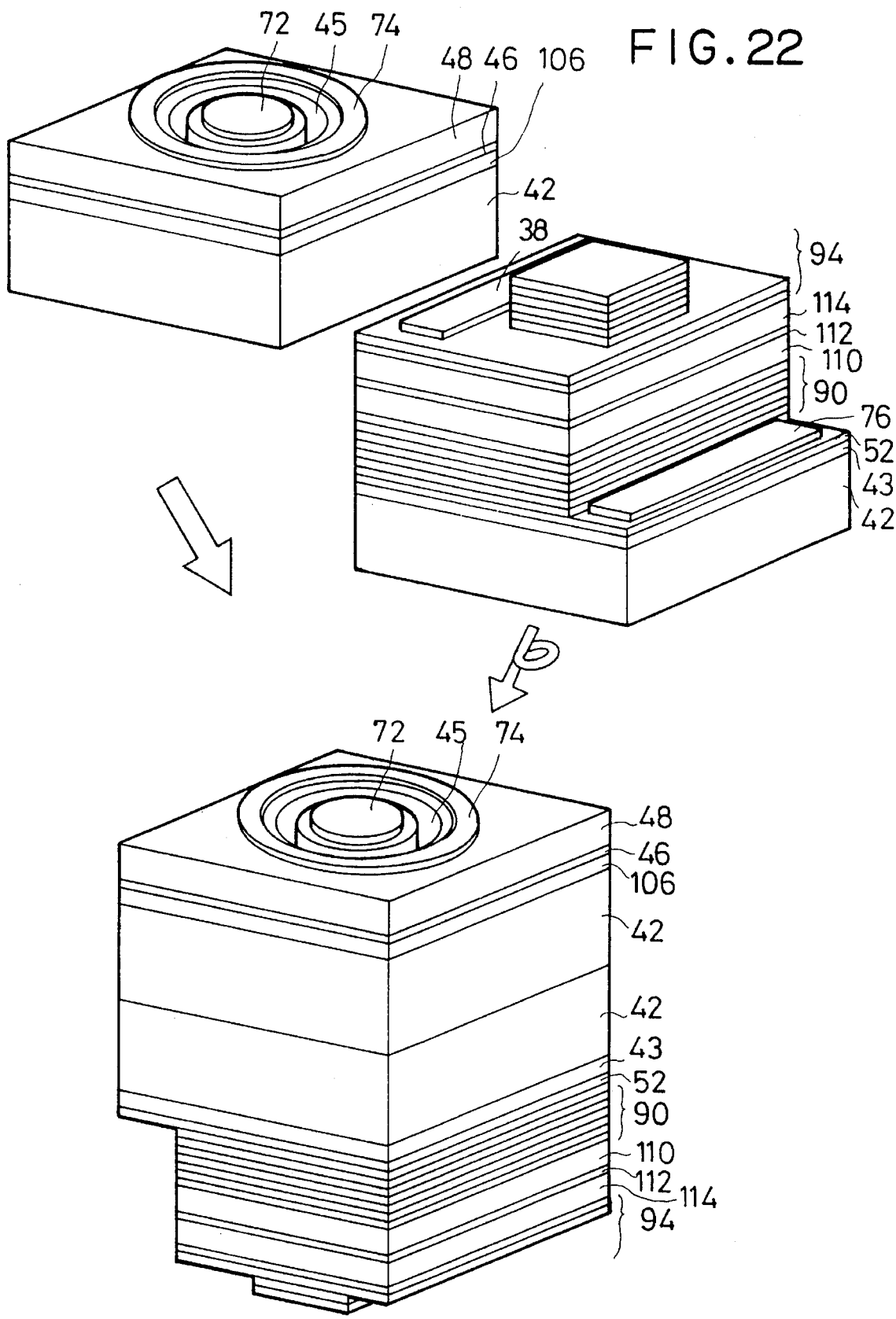
FIG. 22 is a view of a second example of the method for fabricating the optical transmission and reception device according to the ninth embodiment of the present invention.

A second example of the method for fabricating the optical transmission and reception device according to the ninth embodiment will be explained with reference to FIG. 22. In the first example, the optical reception region A is formed on one surface of the n-InP substrate 42, and the optical transmission region B is formed on the other surface of the substrate 42, but in this example the optical transmission region B and the optical reception region A are integrated by cladding to form the optical transmission and reception device according to the ninth embodiment.

First, as in the first example, a surface light emitting DBR laser is formed on the n-InP substrate 42 (FIGS. 21A–21B), as in the second example of the method for fabricating the optical transmission and reception device according to the seventh embodiment, the reception region provided by a PIN photo-diode is formed on the n-InP substrate 42 (FIGS. 14A–14B).

Subsequently, the undersides of the n-InP substrates 42 of both structures are speculum-ground, and the undersides are contacted and annealed. Both undersides of the n-InP substrates are bonded by an intermolecular force therebetween, and the optical transmission and reception device comprising the optical reception region A and the optical transmission region B integrated respectively on one surface of the n-InP substrate 42 and on the other surface thereof (FIG. 22).

The present invention is not limited to the above-described embodiments. For example, the semiconductor layers in the above-described embodiments may be formed in opposite conduction type (n-type or p-type) to their stated ones.

What is claimed is:

1. An optical transmission and reception device comprising:

an optical transmission region including an active layer which oscillates and outputs a laser beam having a wavelength $\lambda 1$ during a transmission state and guides received light having a wavelength $\lambda 2$ different from the wavelength $\lambda 1$ during a reception state, and electrodes which inject current into the active layer for oscillating the laser beam; and an optical reception region including a light detecting device for detecting the received light of the wavelength λ2 guided by the active layer and converting the received light into electric signals, and electrodes which apply a bias voltage to the light detecting device for detecting the received light, the optical transmission region and the optical reception region being laminated.

2. An optical transmission and reception device according to claim 1, wherein the optical transmission region further includes received light transmitting means for transmitting outside the received light guided by the active layer; and the optical reception region detects the received light transmitted from the received light transmitting means.

3. An optical transmission and reception device according to claim 2, wherein the received light transmitting means is a diffraction grating formed along the active layer, and having a grating constant which does not diffract the transmitted light but diffracts the received light.

4. An optical transmission and reception device according to claim 3, wherein the diffraction grating is so formed that the grating constant is gradually decreased in the direction of the received light guided by the active layer.

5. An optical transmission and reception device according to claim 1, wherein the optical reception region is formed on one side of the active layer, and detects the received light guided in the active layer.

6. An optical transmission and reception device according to claim 5, wherein the optical transmission region includes distributed bragg reflectors on both sides of the active layer, the distributed bragg reflectors reflecting the transmitted light of the wavelength λ1 and transmitting the received light of the wavelength λ2.

7. An optical transmission and reception device according to claim 1, wherein the optical reception region is formed on one surface of a semiconductor substrate; and the optical transmission region is formed on the optical reception region.

8. An optical transmission and reception device according to claim 2, wherein the optical reception region is formed on one surface of a semiconductor substrate; and the optical transmission region is formed on the optical reception region.

9. An optical transmission and reception device according to claim 3, wherein the optical reception region is formed on one surface of a semiconductor substrate; and the optical transmission region is formed on the optical reception region.

10. An optical transmission and reception device according to claim 4, wherein the optical reception region is formed on one surface of a semiconductor substrate; and the optical transmission region is formed on the optical reception region.

11. An optical transmission and reception device according to claim 5, wherein the optical reception region is formed on one surface of a semiconductor substrate; and the optical transmission region is formed on the optical reception region.

12. An optical transmission and reception device according to claim 6, wherein the optical reception region is formed on one surface of a semiconductor substrate; and the optical transmission region is formed on the optical reception region.

13. An optical transmission and reception device according to claim 1, wherein the optical reception region is formed on one surface of a semiconductor substrate; and the optical transmission region is formed on another surface of the semiconductor substrate.

14. An optical transmission and reception device according to claim 2, wherein the optical reception region is formed on one surface of a semiconductor substrate; and the optical transmission region is formed on another surface of the semiconductor substrate.

15. An optical transmission and reception device according to claim 3, wherein the optical reception region is formed on one surface of a semiconductor substrate; and the optical transmission region is formed on another surface of the semiconductor substrate.

16. An optical transmission and reception device according to claim 4, wherein the optical reception region is formed on one surface of a semiconductor substrate; and the optical transmission region is formed on another surface of the semiconductor substrate.

17. An optical transmission and reception device according to claim 5, wherein the optical reception region is formed on one surface of a semiconductor substrate; and the optical transmission region is formed on another surface of the semiconductor substrate.

18. An optical transmission and reception device according to claim 6, wherein the optical reception region is formed on one surface of a semiconductor substrate; and the optical transmission region is formed on another surface of the semiconductor substrate.

* * * * *